United States Patent
Park et al.

(10) Patent No.: US 10,236,467 B2
(45) Date of Patent: Mar. 19, 2019

(54) ORGANIC LIGHT EMITTING DISPLAY DEVICE AND METHOD FOR MANUFACTURING THE SAME

(71) Applicant: LG Display Co., Ltd., Seoul (KR)

(72) Inventors: TaeHan Park, Seoul (KR); KyungHoon Lee, Goyangi-si (KR); DongHee Yoo, Seoul (KR); Hyeongjun Lim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/786,433

(22) Filed: Oct. 17, 2017

(65) Prior Publication Data

US 2018/0151824 A1  May 31, 2018

(30) Foreign Application Priority Data

Nov. 30, 2016 (KR) .................. 10-2016-0160957

(51) Int. Cl.
*H01L 51/52* (2006.01)
*H01L 51/50* (2006.01)
(Continued)

(52) U.S. Cl.
CPC ........ *H01L 51/5076* (2013.01); *H01L 27/322* (2013.01); *H01L 27/3206* (2013.01); *H01L 27/3246* (2013.01); *H01L 27/3248* (2013.01); *H01L 51/001* (2013.01); *H01L 51/0097* (2013.01); *H01L 51/50* (2013.01);
(Continued)

(58) Field of Classification Search
CPC . H01L 51/5076; H01L 51/5256; H01L 51/56; H01L 51/508; H01L 51/5004; H01L 51/0097; H01L 27/3248; H01L 27/322; H01L 27/3246; H01L 51/001
See application file for complete search history.

(56) References Cited

U.S. PATENT DOCUMENTS

| 2004/0178394 A1* | 9/2004 | Tanaka | .............. C09K 9/02 252/586 |
| 2005/0057460 A1* | 3/2005 | Lee | ............ H01L 27/3248 345/76 |

(Continued)

OTHER PUBLICATIONS

European Search Report for European Patent Application No. EP 17201299, dated Apr. 26, 2018, 8 pages.

*Primary Examiner* — Donald L Raleigh
(74) *Attorney, Agent, or Firm* — Fenwick & West LLP

(57) ABSTRACT

Disclosed is an OLED device capable of reducing the number of manufacturing processes to apply a micro-cavity structure, and a method for manufacturing the same, wherein the OLED device may include a pixel having first to third subpixels, wherein each of the first to third subpixels includes a first electrode including a reflective metal material, an organic light emitting layer on the first electrode, a second electrode disposed on the organic light emitting layer and formed of a transparent metal material, and a semi-transmissive electrode on the second electrode, wherein a distance between the first electrode and the semi-transmissive electrode in the first subpixel, a distance between the first electrode and the semi-transmissive electrode in the second subpixel, and a distance between the first electrode and the semi-transmissive electrode in the third subpixel are different from one another.

19 Claims, 32 Drawing Sheets

(51) Int. Cl.
  *H01L 27/32* (2006.01)
  *H01L 51/00* (2006.01)
  *H01L 51/56* (2006.01)

(52) U.S. Cl.
  CPC ........ *H01L 51/5004* (2013.01); *H01L 51/508* (2013.01); *H01L 51/5225* (2013.01); *H01L 51/5234* (2013.01); *H01L 51/5256* (2013.01); *H01L 51/5265* (2013.01); *H01L 51/56* (2013.01); *H01L 2251/558* (2013.01)

(56) References Cited

U.S. PATENT DOCUMENTS

| | | | |
|---|---|---|---|
| 2005/0161665 A1* | 7/2005 | Winters | H01L 27/322 257/40 |
| 2007/0102737 A1* | 5/2007 | Kashiwabara | H01L 27/3211 257/291 |
| 2011/0042697 A1* | 2/2011 | Lee | H01L 27/322 257/89 |
| 2014/0077185 A1 | 3/2014 | Lee et al. | |
| 2014/0159021 A1* | 6/2014 | Song | H01L 27/322 257/40 |
| 2014/0167005 A1 | 6/2014 | Kim et al. | |
| 2015/0028294 A1 | 1/2015 | Kim et al. | |
| 2015/0226890 A1* | 8/2015 | Jin | G02B 5/23 359/242 |
| 2016/0118626 A1 | 4/2016 | Seo et al. | |
| 2017/0104036 A1* | 4/2017 | Maeda | H01L 27/3211 |

* cited by examiner

Open-ring structure     Close-ring structure

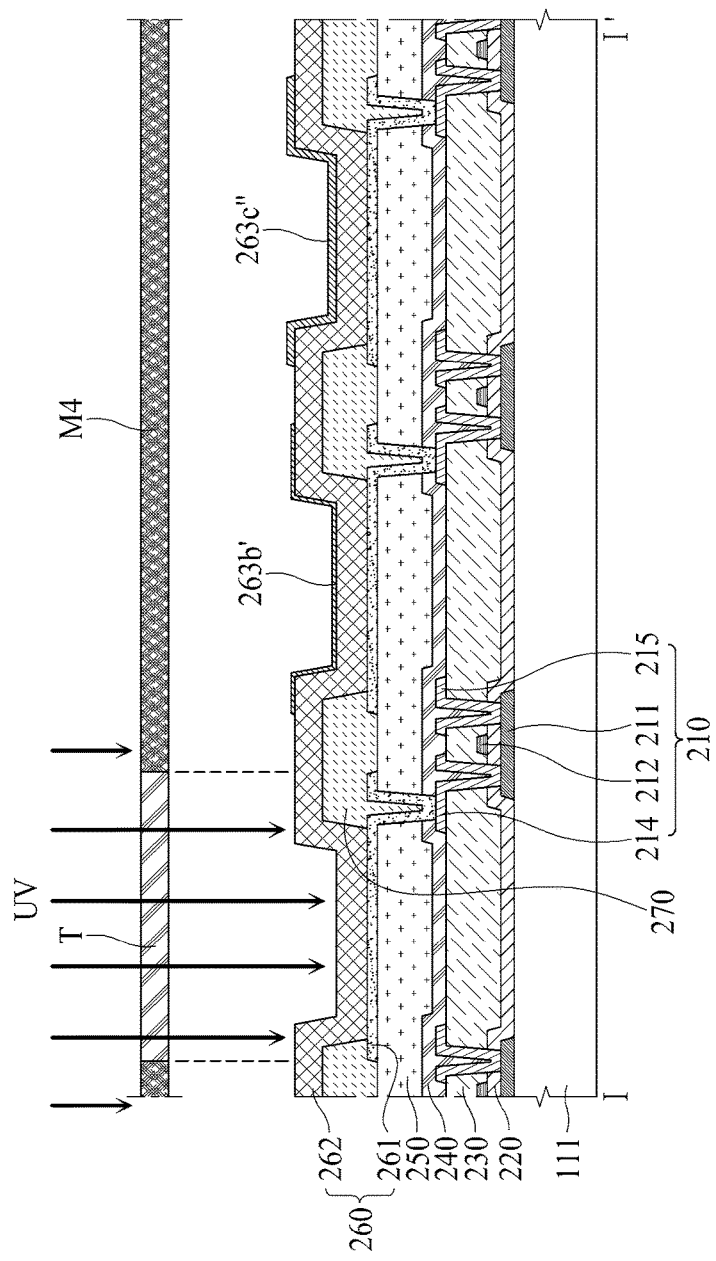

ORGANIC LIGHT EMITTING DISPLAY DEVICE AND METHOD FOR MANUFACTURING THE SAME

CROSS REFERENCE TO RELATED APPLICATIONS

This application claims priority to Republic of Korea Patent Application No. 10-2016-0160957 filed on Nov. 30, 2016, which is hereby incorporated by reference as if fully set forth herein.

BACKGROUND

Field of the Disclosure

Embodiments of the present disclosure relate to an organic light emitting display device and a method for manufacturing the same.

Discussion of the Related Art

With the advancement of an information-oriented society, various requirements for the display device of displaying an image are increasing. Thus, various display devices of a liquid crystal display (LCD) devices, a plasma display panel (PDP) devices, and an organic light emitting display (OLED) device have been utilized.

The OLED device is a self-light emitting display device. In comparison to the LCD device, the OLED device has wider viewing angle and greater contrast ratio. Also, the OLED device may be fabricated at a lightweight and slim size as it does not need a separate light source unlike the LCD device, and furthermore the OLED device is favorable in view of power consumption. In addition, the OLED device may be driven by a low D.C. voltage, and a response speed of the OLED device is fast. Especially, the OLED device may have the advantage of low manufacturing cost.

The OLED device may include pixels respectively provided with organic light emitting devices, and a bank for dividing the pixels so as to define the pixels. The bank functions as a pixel defining film. The organic light emitting device may include an anode electrode, a hole transporting layer, an organic light emitting layer, an electron transporting layer, and a cathode electrode. In this case, when a high potential voltage is applied to the anode electrode, and a low potential voltage is applied to the cathode electrode, holes and electrons are respectively moved to the organic light emitting layer via the hole transporting layer and the electron transporting layer, and are then combined to each other in the organic light emitting layer, to thereby emit light.

If the organic light emitting device includes only a white organic light emitting layer, the organic light emitting layer is formed as a common layer for the pixels. Accordingly, it is necessary to provide red, green, and blue color filters for realizing red, green, and blue colors, and a black matrix.

In case of the OLED device, the organic light emitting layer is deteriorated in accordance with a driving time, whereby a lifespan of the organic light emitting layer is short. Also, a polarizing plate for preventing a reflection of external light is attached to the OLED device, whereby some of light emitted from the organic light emitting layer may be lost by the polarizing plate. Accordingly, there is a need to provide a method for improving an emission efficiency of light emitted from the organic light emitting layer. In order to improve the emission efficiency, a micro-cavity structure may be applied to the organic light emitting device.

Herein, the micro-cavity indicates that the light-emission efficiency is improved by amplification and constructive interference of the light through repetitive reflection and re-reflection of the light emitted from the organic light emitting layer between the anode and cathode electrodes. In a top emission type wherein light advances to a direction of the cathode electrode, the anode electrode is formed of a reflection electrode, and the cathode electrode is formed of a semi-transmissive electrode, it is possible to improve the emission efficiency of light emitted from the organic light emitting layer by the use of micro-cavity structure.

Meanwhile, a wavelength of light in a red pixel emitted through the red color filter, a wavelength of light in a green pixel emitted through the green color filter, and a wavelength of light in a blue pixel emitted through the blue color filter are different from one another. Accordingly, in order to optimize the micro-cavity, a thickness of the anode electrode in the red pixel, a thickness of the anode electrode in the green pixel, and a thickness of the anode electrode in the blue pixel are different from each other so that it is possible to optimize a micro-cavity distance in each of the red, green, and blue pixels. However, a deposition process, a photo process, and an etching process have to be repetitively carried out for each of the red, green, and blue pixels so as to provide the anode electrodes having the different thicknesses in the respective red, green, and blue pixels. That is, if applying the micro-cavity structure, nine manufacturing processes are additionally carried out. Accordingly, if applying the micro-cavity structure, a manufacturing process is complicated, and a manufacturing cost is also increased.

SUMMARY

Accordingly, embodiments of the present disclosure are directed to an organic light emitting display device that substantially obviates one or more problems due to limitations and disadvantages of the related art, and a method for manufacturing the same.

An aspect of embodiments of the present disclosure is directed to provide an organic light emitting display device which is capable of reducing the number of manufacturing processes to apply a micro-cavity structure, and a method for manufacturing the same.

Additional advantages and features of embodiments of the disclosure will be set forth in part in the description which follows and in part will become apparent to those having ordinary skill in the art upon examination of the following or may be learned from practice of embodiments of the disclosure. The objectives and other advantages of embodiments of the disclosure may be realized and attained by the structure particularly pointed out in the written description and claims hereof as well as the appended drawings.

To achieve these and other advantages and in accordance with the purpose of embodiments of the disclosure, as embodied and broadly described herein, there is provided an organic light emitting display (OLED) device that may include a pixel having a first subpixel, a second subpixel, and a third subpixel, wherein each of the first subpixel, the second subpixel, and the third subpixel includes a first electrode including a reflective metal material, an organic light emitting layer disposed on the first electrode, a second electrode disposed on the organic light emitting layer and formed of a transparent metal material, and a semi-transmissive electrode disposed on the second electrode, wherein a first distance between the first electrode and the semi-transmissive electrode in the first subpixel, a second distance between the first electrode and the semi-transmissive electrode in the second subpixel, and a third distance between the first electrode and the semi-transmissive electrode in the third subpixel are different from one another.

In another aspect of an embodiment of the present disclosure, there is provided a method for manufacturing an OLED device that may include forming first electrodes on a first substrate, forming an organic light emitting layer on the first electrodes, forming a second electrode on the organic light emitting layer, and forming a photo-reactive organic film on the second electrode. The method further includes disposing a mask including a first transmitting portion, a second transmitting portion, and a third transmitting portion on the photo-reactive organic film, and irradiating UV onto the mask, wherein the first transmitting portion having a first UV transmittance is positioned above an area for a first subpixel, the second transmitting portion having a second UV transmittance, which is higher than the first UV transmittance, is positioned above an area for a second subpixel, and the third transmitting portion having a third UV transmittance, which is higher than the second UV transmittance, is positioned above an area for a third subpixel. The method further includes depositing a metal film on the photo-reactive organic film by the use of open mask, forming a first optical auxiliary layer having a first thickness in the first subpixel, forming a second optical auxiliary layer having a second thickness in the second subpixel, and forming a third optical auxiliary layer having a third thickness in the third subpixel. The open mask may have a fourth transmittance portion corresponding to a display area of the first substrate. The method further includes forming a semi-transmissive electrode on the first to third optical auxiliary layers.

In another aspect of an embodiment of the present disclosure, there is provided a method for manufacturing an OLED device that may include forming first electrodes on a first substrate, forming an organic light emitting layer on the first electrodes, forming a second electrode on the organic light emitting layer, and forming a photo-reactive organic film on the second electrode. The method further includes disposing a first mask having a first transmitting portion above an area for a first subpixel on the photo-reactive organic film, irradiating UV onto the area for the first subpixel, and depositing a first metal film with an open mask having a second transmitting portion corresponding to a display area of the first substrate. The method further includes disposing a second mask having a third transmitting portion above an area for a second subpixel on the photo-reactive organic film, irradiating UV onto the area for the second subpixel, and depositing a second metal film by the use of open mask. The method further includes forming a first optical auxiliary layer having a first thickness in the area for the first subpixel, a second optical auxiliary layer having a second thickness in the area for the second subpixel, and a third optical auxiliary layer having a third thickness in the area for the third subpixel by disposing a third mask having a fourth transmitting portion above an area for a third subpixel on the photo-reactive organic film, irradiating UV thereonto, and depositing a metal film by the use of open mask. The method further includes forming a semi-transmissive electrode on the first to third optical auxiliary layers.

Embodiments also relate to a light emitting display device. The light emitting display device includes a substrate, a first subpixel on the substrate, and a second subpixel on the substrate. The first subpixel includes a first bottom electrode, at least a first part of an organic light emitting layer on the first bottom electrode, a first conductive film on the first part of the organic light emitting layer, and at least a first part of a semi-transmissive electrode on the first conductive film. The second subpixel includes a second bottom electrode, at least a second part of the organic light emitting layer on the second bottom electrode, a second conductive film on the second part of the organic light emitting layer, and at least a second part of the semi-transmissive electrode on the second conductive film. The thickness of the second conductive film is greater than a thickness of the first conductive film.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate embodiment(s) of the invention and together with the description serve to explain the principle of embodiments of the invention. In the drawings:

FIGS. 15A to 15H are cross sectional views illustrating the method for manufacturing the OLED device according to another embodiment of the present disclosure.

DETAILED DESCRIPTION OF THE INVENTION

Figure 1:
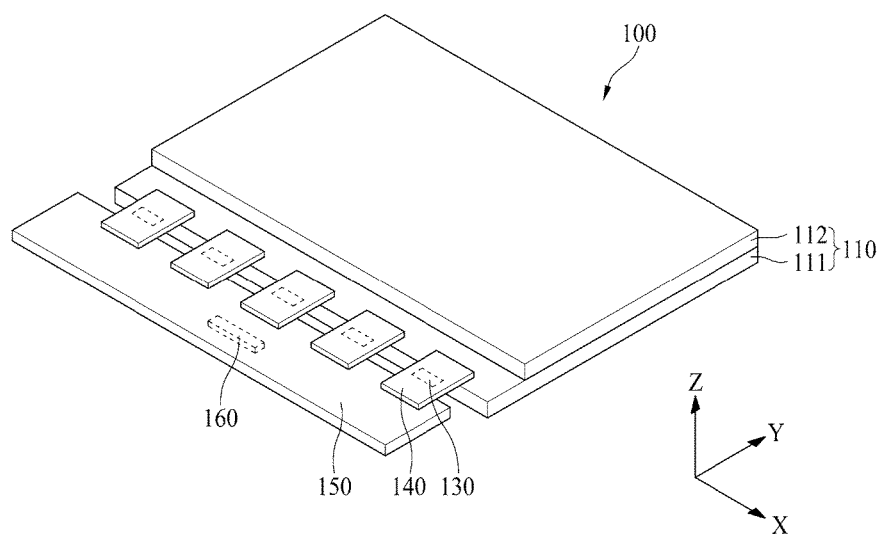
FIG. 1 is a perspective view illustrating an OLED device according to one embodiment of the present disclosure.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error region although there is no explicit description.

In describing a position relationship, for example, when the positional order is described as 'on~', 'above~', 'below~', and 'next~', a case which is not contact may be included unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Also, "X-axis direction", "Y-axis direction", and "Z-axis direction" are not limited to a perpendicular geometric configuration. That is, "X-axis direction", "Y-axis direction", and "Z-axis direction may include an applicable wide range of a functional configuration.

Also, it should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, an organic light emitting display (OLED) device according to the embodiment of the present disclosure and a method for manufacturing the same will be described in detail with reference to the accompanying drawings.

Figure 2:
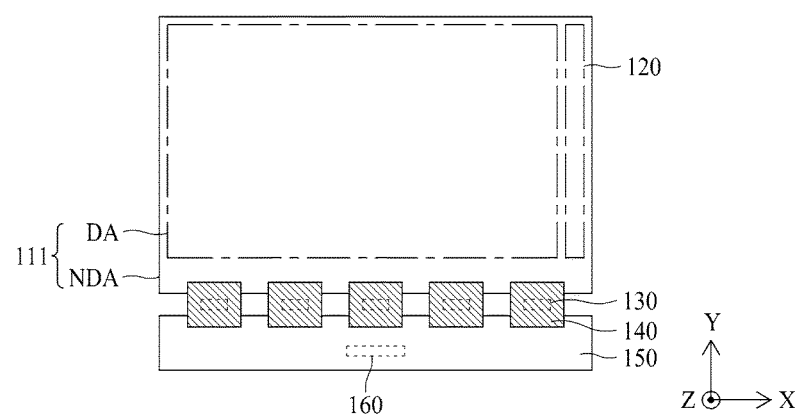
FIG. 2 is a plane view illustrating a first substrate, a gate driver, a source drive IC, a flexible film, a circuit board, and a timing controller of FIG. 1 according to one embodiment of the present disclosure.

FIG. 1 is a perspective view illustrating an OLED device according to one embodiment of the present disclosure. FIG. 2 is a plane view illustrating a first substrate, a gate driver, a source drive IC, a flexible film, a circuit board, and a timing controller of FIG. 1 according to an embodiment of the present disclosure.

Referring to FIGS. 1 and 2, a display device 100 according to one embodiment of the present disclosure may include a display panel 110, a gate driver 120, a source drive integrated circuit (source drive IC) 130, a flexible film 140, a circuit board 150, and a timing controller 160.

The display panel 110 may include a first substrate 111 and a second substrate 112. The second substrate 112 may be an encapsulation substrate. The first substrate 111 may be a plastic film or a glass substrate. The second substrate 112 may be a plastic film, a glass substrate, or an encapsulation film (or protection film).

On one surface of the first substrate 111 facing the second substrate 112, there are gate lines, data lines, and subpixels. The subpixels are prepared in respective areas defined by crossing the gate lines and the data lines.

Each of the subpixels may include a thin film transistor, and an organic light emitting device including a first electrode, an organic light emitting layer, and a second electrode. If a gate signal is supplied from a gate line to each subpixel through the thin film transistor, a predetermined current is supplied to the organic light emitting device in accordance with a data voltage of the data line. Accordingly, the organic light emitting device for each of the subpixels may emit light with a predetermined brightness in accordance with the predetermined current. A structure of each of the subpixels will be described in detail with reference to FIG. 4.

As shown in FIG. 2, the display panel 110 may include a display area (DA) provided with the subpixels for displaying an image, and a non-display area (NDA) in which an image is not displayed. The gate lines, the data lines, and the subpixels may be provided in the display area (DA), and the gate driver 120 and pads may be provided in the non-display area (NDA).

The gate driver 120 supplies gate signals to the gate lines in accordance with a gate control signal which is provided from the timing controller 160. The gate driver 120 may be provided in one side of the display area (DA) of the display panel 110, or the non-display area (NDA) of both peripheral sides of the display panel 110 by a gate driver in panel (GIP) method. In another way, the gate driver 120 may be manufactured in a driving chip, may be mounted on the flexible film, and may be attached to one side of the display area (DA) of the display panel 110, or the non-display area (NDA) of both peripheral sides of the display panel 110 by a tape automated bonding (TAB) method.

The source drive IC 130 receives digital video data and source control signals from the timing controller 160. The source drive IC 130 converts the digital video data into analog data voltages in accordance with the source control signal, and supplies the analog data voltages to the data lines. If the source drive IC 130 is manufactured in a driving chip, the source drive IC 130 may be mounted on the flexible film 140 by a chip on film (COF) method or a chip on plastic (COP) method.

The pads such as data pads may be provided in the non-display area (NDA) of the display panel 110. In the flexible film 140, there are lines for connecting the pads with the source drive IC 130, and lines for connecting the pads with the lines of the circuit board 150. The flexible film 140 is attached to the pads by the use of anisotropic conducting film, whereby the pads may be connected with the lines of the flexible film 140.

The circuit board 150 may be attached to the flexible film 140. A plurality of circuits, which are realized in a plurality of driving chips, may be mounted on the circuit board 150. For example, the timing controller 160 may be mounted on the circuit board 150. The circuit board 150 may be a printed circuit board or a flexible printed circuit board.

The timing controller 160 receives digital video data and a timing signal from an external system board via a cable of the circuit board 150. The timing controller 160 generates the gate control signal for controlling an operation timing of the gate driver 120 and the source control signal for controlling the source drive IC 130 on the basis of the timing signal. The timing controller 160 supplies the gate control signal to the gate driver 120, and supplies the source control signal to the source drive IC 130.

Figure 3:
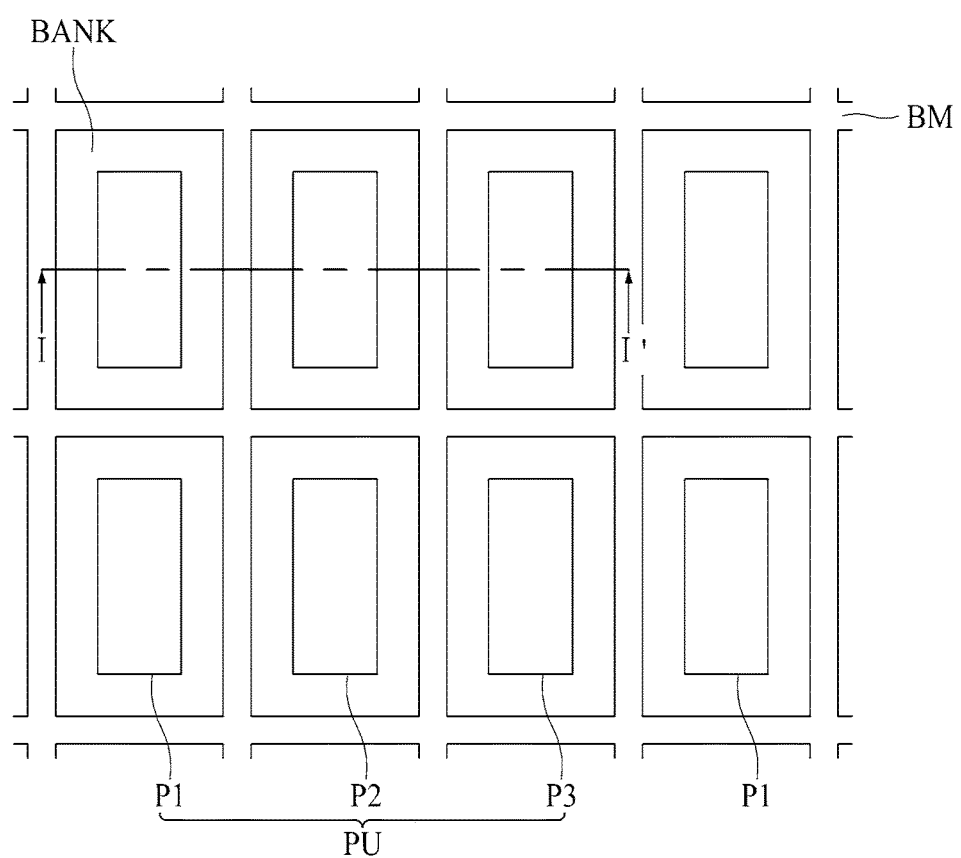
FIG. 3 is a plane view illustrating one example of subpixels in a display area.

FIG. 3 is a plane view illustrating one example of the subpixels in the display area. For convenience of explanation, FIG. 3 shows only a pixel including subpixels (P1, P2, P3), bank (BANK), and black matrix (BM).

Referring to FIG. 3, each of the subpixels (P1, P2, P3) is a light-emission area which is obtained by sequentially depositing a first electrode corresponding to an anode electrode, an organic light emitting layer, and a second electrode corresponding to a cathode electrode, wherein holes and electrons are respectively supplied from the first electrode and the second electrode, and are then combined with each other in the organic light emitting layer so as to emit light.

The organic light emitting layer of the subpixels (P1, P2, P3) may be provided in a common layer for the subpixels (P1, P2, P3), to thereby emit white light. In this case, a first color filter is disposed in the first subpixel (P1), a second color filter is disposed in the second subpixel (P2), and a third color filter is disposed in the third subpixel (P3). The first subpixel (P1) emits first-color light by the first color filter, the second subpixel (P2) emits second-color light by the second color filter, and the third subpixel (P3) emits third-color light by the third color filter.

The first to third subpixels (P1, P2, P3) may be defined as a pixel (PU). In this case, the first subpixel P1 may be a red pixel, the second subpixel P2 may be a green subpixel, and the third subpixel P3 may be a blue subpixel, but may not be limited to this structure. For example, red, green, blue, and white pixels may be defined as a pixel (PU).

The bank (BANK) is provided to divide the subpixels (P1, P2, P3), whereby the bank (BANK) serves as a pixel defining film for defining the subpixels (P1, P2, P3).

The black matrix (BM) is provided to divide the color filters. The black matrix (BM) may be overlapped with the bank (BANK) so as to prevent light of any one subpixel from being emitted toward the neighboring subpixel and mixed with light of the neighboring subpixel.

Figure 4:
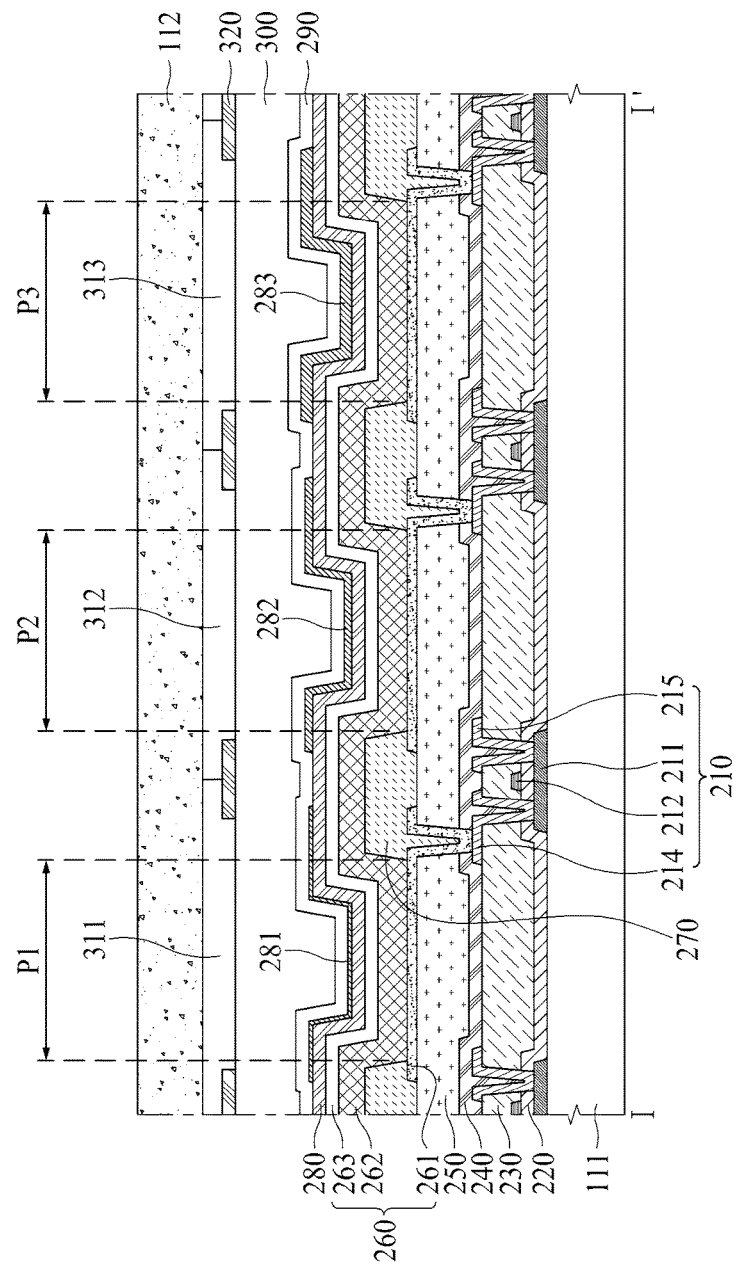
FIG. 4 is a cross sectional view along I-I' of FIG. 3 according to one embodiment of the present disclosure.

FIG. 4 is a cross sectional view illustrating one example along cross-section I-I' of FIG. 3.

Referring to FIG. 4, a buffer film is provided on one surface of the first substrate 111 facing the second substrate 112. The buffer film is provided on one surface of the first substrate 111 so as to protect thin film transistors 210 and organic light emitting devices 260 from moisture permeating through the first substrate 111 which is vulnerable to moisture permeability. The buffer film may be formed of a plurality of inorganic films deposited alternately. For example, the buffer film may be formed in a multi-layered structure by alternately depositing at least one inorganic film from a silicon oxide film (SiOx), a silicon nitride film (SiNx), and silicon oxynitride (SiON). It is possible to omit the buffer film.

The thin film transistor 210 is provided on the buffer film. The thin film transistor 210 includes an active layer 211, a gate electrode 212, a source electrode 213, and a drain electrode 214. In FIG. 4, the thin film transistor 210 is provided in a top gate type where the gate electrode 212 is positioned above the active layer 211, but not limited to this type. For example, the thin film transistor 210 may be provided in a bottom gate type where the gate electrode 212 is positioned below the active layer 211, or a double gate type where the gate electrode 212 is positioned both above and below the active layer 211.

The active layer 211 is provided on the buffer film. The active layer 211 may be formed a silicon-based semiconductor material or an oxide-based semiconductor material. A light shielding layer may be additionally provided between the buffer film and the active layer 211 so as to block external light being incident on the active layer 211.

A gate insulating film 220 may be provided on the active layer 211. The gate insulating film 220 may be formed in a single-layered structure of the inorganic insulating material such as silicon oxide (SiOx) or silicon nitride (SiNx), or a multi-layered structure of the above silicon oxide (SiOx) and silicon nitride (SiNx).

The gate electrode 212 and gate line may be provided on the gate insulating film 220. The gate electrode 212 and gate line may be formed in a single-layered structure or multi-layered structure among molybdenum (Mo), aluminum (Al), chrome (Cr), aurum (Au), titanium (Ti), nickel (Ni), neodymium (Nd), copper (Cu) and their alloys.

An insulating interlayer 230 may be provided on the gate electrode 212 and gate line. The insulating interlayer 230 may be formed in a single-layered structure of the inorganic insulating material such as silicon oxide (SiOx) or silicon nitride (SiNx), or a multi-layered structure of the above silicon oxide (SiOx), silicon nitride (SiNx) and their alloys.

The source electrode 214, the drain electrode 215, and the data line may be provided on the insulating interlayer 230. Each of the source electrode 214 and the drain electrode 215 may be connected with the active layer 211 via a contact hole penetrating through the gate insulating film 220 and the insulating interlayer 230. The source electrode 214, the drain electrode 215, and the data line may be formed in a single-layered structure or multi-layered structure among molybdenum (Mo), aluminum (Al), chrome (Cr), aurum (Au), titanium (Ti), nickel (Ni), neodymium (Nd), copper (Cu) and their alloys.

A protection film 240 for an insulation of the thin film transistor 210 may be provided on the source electrode 214, the drain electrode 215, and the data line. The protection film 240 may be formed in a single-layered structure of the inorganic material such as silicon oxide (SiOx) or silicon nitride (SiNx), or a multi-layered structure of the above silicon oxide (SiOx) and silicon nitride (SiNx).

A planarization film 250 may be provided on the protection film 240 so as to planarize a step difference area caused by the thin film transistor 210. The planarization film 250 may be formed of an organic material, for example, acryl resin, epoxy resin, phenolic resin, polyamide resin, polyimide resin, and etc.

The organic light emitting device 260 and the bank 270 are provided on the planarization film 250. The organic light emitting device 260 may include the first electrode 261, the organic light emitting layer 262, and the second electrode 263. The first electrode 261 may serve as an anode electrode, and the second electrode 263 may serve as a cathode electrode.

The first electrode 261 may be provided on the planarization film 250. The first electrode 261 may also be referred to as a bottom electrode. The first electrode 261 may be connected with the source electrode 214 of the thin film transistor 210 via a contact hole penetrating through the protection film 240 and the planarization film 250. According as the OLED device according to the embodiment of the present disclosure is formed in the top emission type, the first electrode 261 may include a reflection metal material for reflecting light from the organic light emitting layer 262 to the second electrode 263. For example, the first electrode 261 may be formed of a metal material with high reflectance, and more particularly, a deposition structure of aluminum and titanium (Ti/Al/Ti), a deposition structure of aluminum and Indium Tin Oxide (ITO/AL/ITO), an APC alloy, and a deposition structure of APC alloy and Indium Tin Oxide (ITO/APC/ITO). Herein, the APC alloy is an alloy of argentums (Ag), palladium (Pd), and copper (Cu).

The bank 270 is provided to cover the edge of the first electrode 261 on the planarization film 250, to thereby divide the subpixels (P1, P2, P3). That is, the bank 270 functions as the pixel defining film so as to define the subpixels (P1, P2, P3).

Each of the subpixels (P1, P2, P3) indicates a light-emission area, wherein the first electrode 261 corresponding to the anode electrode, the organic light emitting layer 262, and the second electrode 263 corresponding to the cathode electrode are sequentially deposited in each subpixel, and hole and electron are respectively supplied from the first electrode 261 and the second electrode 263, and are then combined with each other in the organic light emitting layer 262 so as to emit light. In this case, the area for the bank 270 does not emit light, whereby the area for the bank 270 may be defined as a non-emission area.

The bank 270 may be formed of an organic material, for example, acryl resin, epoxy resin, phenolic resin, polyamide resin, polyimide resin, and etc.

The organic light emitting layer 262 is provided on the first electrode 261 and the bank 270. The organic light emitting layer 262 is a common layer provided on the subpixels (P1, P2, P3) in common. The organic light emitting layer may be a white light emitting layer for emitting white light. In this case, the organic light emitting layer 262 may have a tandem structure of 2 stacks or more than 2 stacks. Each stack may include a hole transporting layer, at least one light emitting layer, and an electron transporting layer. Each subpixel may include a corresponding part of the organic light emitting layer 262 disposed on the first electrode 261 of the subpixel. Thus, the first subpixel P1 may include at least a first part of the organic light emitting layer 262 on the first electrode 261 of the first subpixel P1, the second subpixel P2 may include at least a second part of the organic light emitting layer 262 on the first electrode 261 of the second subpixel P2, and the third subpixel P3 may include at least a third part of the organic light emitting layer 262 on the first electrode 261 of the third subpixel P3.

Between each of the stacks, there may be a charge generation layer. The charge generation layer may include an n-type charge generation layer positioned adjacent to the lower stack, and a p-type charge generation layer provided on the n-type charge generation layer and positioned adjacent to the upper stack. The n-type charge generation layer injects the electron into the lower stack, and the p-type charge generation layer injects the hole into the upper stack. The n-type charge generation layer may be formed of an organic layer obtained by doping an organic host material having an electron transporting capacity with alkali metal such as lithium (Li), natrium (Na), kalium (K) or cesium (Cs), or alkali earth metal such as magnesium (Mg), strontium (Sr), barium (Ba) or radium (Ra). The P-type charge generation layer may be formed of an organic layer obtained by doping an organic host material having a hole transporting capacity with dopant.

The second electrode 263 is provided on the organic light emitting layer 262. The second electrode 263 may also be referred to as an upper electrode. The second electrode 263 is a common layer provided on the subpixels (P1, P2, P3) in common. The second electrode 263 may be formed of a conductive film, and more specifically a metal film. In one embodiment, the second electrode 263 is formed of a transparent metal material (transparent conductive material, TCO) capable of transmitting light therethrough, for example, Indium Tin Oxide (ITO) or Indium Zinc Oxide (IZO). A capping layer may be provided on the second electrode 263.

Figure 5:
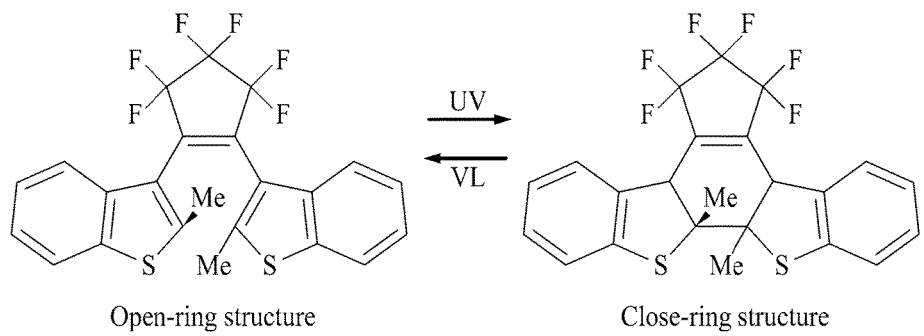
FIG. 5 is a chemical formula showing one example of a photo-reactive organic film.

The photo-reactive organic film 280 is provided on the second electrode 263. As shown in FIG. 5, the photo-reactive organic film 280 includes diarylethene molecules, whereby it has the photo-isomerization properties. For example, the photo-reactive organic film 280 may be formed in a structure obtained by combining a host organic material with diarylethene molecules. The host organic material may be organoboron molecules obtained by combining boron with carbon such as BMB-2T, oxadiazole molecules such as PBD, azole-based molecules such as TAZ or TPBI, triazole molecules, or silole-based molecules.

As shown in FIG. 5, if the diarylethene molecules are irradiated with ultraviolet rays (hereinafter, referred to as "UV"), its structure is changed from an open-ring structure into a close-ring structure. Meanwhile, if the diarylethene molecules are irradiated with visible rays (hereinafter, referred to as "VR"), its structure is changed from the close-ring structure into the open-ring structure.

If the diarylethene molecules have the open-ring structure, the photo-reactive organic film 280 has a hydrophobic property by a large amount of fluorine. Thus, if the diarylethene molecules have the open-ring structure, an adhesion property between the photo-reactive organic film 280 and a conductive film, such as a metal film, is not good so that it is difficult to deposit the conductive film on the photo-reactive organic film 280.

If the diarylethene molecules have the close-ring structure, the fluorine molecules in the surface of the photo-reactive organic film 280 are arranged inside the photo-reactive organic film 280. Thus, the surface of the photo-reactive organic film 280 has a hydrophilic property, whereby the conductive film is easily deposited on the photo-reactive organic film 280.

If using the photo-isomerization properties in the diarylethene molecules of the photo-reactive organic film 280, the conductive film may be selectively provided on predetermined areas. Accordingly, the areas of the first to third subpixels (P1, P2, P3) are irradiated with UV, and a first conductive film corresponding to a first optical auxiliary layer 281 is deposited on the area corresponding to the first subpixel (P1), a second conductive film corresponding to a second optical auxiliary layer 282 is deposited on the area corresponding to the second subpixel (P2), and a third conductive film corresponding to a third optical auxiliary layer 283 is deposited on the area corresponding to the third subpixel (P3). The first optical auxiliary layer 281 may be disposed above the first part of the organic light emitting layer 262 in the first subpixel P1, the second optical auxiliary layer 282 may be disposed above the second part of the organic light emitting layer 262 in the second subpixel P2, and the third optical auxiliary layer 283 may be disposed above the third part of the organic light emitting layer 263 in the third subpixel P3.

In one embodiment referred throughout the remainder of the specification, the first optical auxiliary layer 281, the second optical auxiliary layer 282, and the third optical auxiliary layer 283 may be formed of a metal film. The first to third optical auxiliary layers 281, 282, and 283 may be formed of a transparent metal material (transparent conductive material, TCO) capable of transmitting light therethrough, for example, Indium Tin Oxide (ITO) or Indium Zinc Oxide (IZO). However, it is appreciated that in other embodiments, the optical auxiliary layers can be a conductive film other than a metal film.

Also, it is possible to adjust a thickness of the metal film deposited on the photo-reactive organic film 280 in accordance with an amount of UV irradiation. As the amount of UV irradiation is increased, the thickness of the metal film deposited on the photo-reactive organic film 280 becomes thicker. Thus, if the amount of UV irradiation applied to the photo-reactive organic film 280 overlapping with the third subpixel (P3) is the largest, and the amount of UV irradiation applied to the photo-reactive organic film 280 overlapping with the first subpixel (P1) is the smallest, the thickness of the third optical auxiliary layer 283 is the largest, and the thickness of the first optical auxiliary layer 281 is the smallest. That is, the first optical auxiliary layer 281, the second optical auxiliary layer 282, and the third optical auxiliary layer 283 may have the different thicknesses from one another.

A semi-transmissive electrode 290 is provided on the photo-reactive organic film 280, and the first to third optical auxiliary layers 281, 282, and 283. The semi-transmissive electrode 290 may be formed of a semi-transmissive conductive material such as magnesium (Mg), argentums (Ag), or alloy of magnesium (Mg) and argentums (Ag). Specifically, a first part of the semi-transmissive electrode 290 may be disposed on the first optical auxiliary layer 281, a second part of the semi-transmissive electrode 290 may be disposed on the second optical auxiliary layer 282, and a third part of the semi-transmissive electrode 290 may be disposed on the third optical auxiliary layer 283.

According to the embodiment of the present disclosure, the first electrode 261 is formed of the metal material with high reflectance, and the semi-transmissive electrode 290 is formed of the semi-transmissive metal material, whereby it is possible to realize a micro-cavity structure by the first electrode 261 and the semi-transmissive electrode 290, to thereby improve an emission efficiency of light emitted from the organic light emitting layer 262. Herein, the micro-cavity indicates that the light-emission efficiency is improved by amplification and constructive interference of the light through repetitive reflection and re-reflection of the light, which is emitted from the organic light emitting layer 262, between the first electrode 261 and the semi-transmissive electrode 290.

According to the embodiment of the present disclosure, the first optical auxiliary layer 281 of the first subpixel (P1), the second optical auxiliary layer 282 of the second subpixel (P2), and the third optical auxiliary layer 283 of the third subpixel (P3) have the different thicknesses from one another, whereby it is possible to optimize a micro-cavity distance in each of the first to third subpixels (P1, P2, P3). The second electrode 263 is disposed between the first optical auxiliary layer 281 and the first part of the organic light emitting layer 262, between the second optical auxiliary layer 282 and the second part of the organic light emitting layer 262, and between the third optical auxiliary layer 283 and the third part of the organic light emitting layer 263. The photo-reactive organic film 280 is disposed between the first optical auxiliary layer 281 and the second electrode 263, between the second optical auxiliary layer 282 and the second electrode 263, and between the third optical auxiliary layer 283 and the second electrode 263.

An encapsulation film 300 is provided on the semi-transmissive electrode 290. The encapsulation film 300 may prevent permeation of oxygen or moisture into the organic light emitting layer 262 and the second electrode 263. The encapsulation film 300 may include at least one inorganic film. The inorganic film may be formed of silicon nitride, aluminum nitride, zirconium nitride, titanium nitride, hafnium nitride, tantalum nitride, silicon oxide, aluminum oxide, or titanium oxide.

Also, the encapsulation film 300 may include at least one organic film. The organic film may be formed at a thickness enough to prevent particles from getting into the organic light emitting layer 262 and the second electrode 263 through the encapsulation film 300.

The color filters 311, 312, and 313 are provided on the encapsulation film 300. If the color filters 311, 312, and 313 are provided on the encapsulation film 300, there is no need for an alignment process when the first and second substrates 111 and 112 are bonded to each other, whereby it is possible to reduce a thickness of the display panel since there is no need for an additional adhesion layer.

The color filters 311, 312, and 313 may be disposed in the respective subpixels (P1, P2, P3). For example, as shown in FIG. 4, the first color filter 311 is disposed in the first subpixel (P1), the second color filter 312 is disposed in the second subpixel (P2), and the third color filter 313 is disposed in the third subpixel (P3). The black matrix 320 is disposed between each of the color filters 311, 312, and 313.

An overcoat layer may be provided on the color filters 311, 312, and 313 so as to planarize a step difference area caused by the color filters 311, 312, and 313 and the black matrix 320. The second substrate 112 is disposed on the color filters 311, 312, and 313. The second substrate 112 may be a plastic film, a glass substrate, or an encapsulation film (protection film).

According to the embodiment of the present disclosure, the first electrode 261 is formed of the metal material with high reflectance, and the semi-transmissive electrode 290 is formed of the semi-transmissive metal material, whereby it is possible to realize the micro-cavity structure by the first electrode 261 and the semi-transmissive electrode 290, to thereby improve the emission efficiency of light emitted from the organic light emitting layer 262. Also, the first optical auxiliary layer 281 of the first subpixel (P1), the second optical auxiliary layer 282 of the second subpixel (P2), and the third optical auxiliary layer 283 of the third subpixel (P3) have the different thicknesses from one another, whereby it is possible to optimize the micro-cavity distance in each of the first to third subpixels (P1, P2, P3).

In this embodiment of the present disclosure, the thickness of the first optical auxiliary layer 281 is the smallest, and the thickness of the third optical auxiliary layer 283 is the largest, but not limited to this structure. That is, the thickness of each of the first to third optical auxiliary layers 281, 282, and 283 may be designed in an optimum range through a pretest in consideration of a wavelength of the light emitted from the subpixels, and a distance between the first electrode 261 and the semi-transmissive electrode 290.

Figure 6:
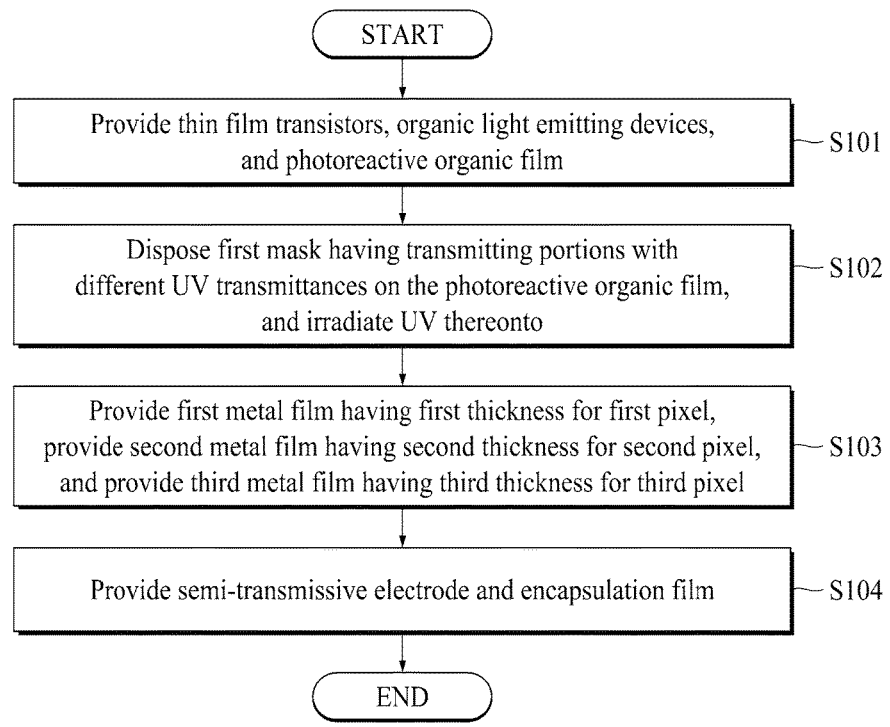
FIG. 6 is a flow chart illustrating a method for manufacturing an OLED device according to one embodiment of the present disclosure.

FIG. 6 is a flow chart illustrating a method for manufacturing an OLED device according to one embodiment of the present disclosure. FIGS. 7A to 7D are cross sectional views illustrating the method for manufacturing the OLED device according to one embodiment of the present disclosure.

The cross sectional views shown in FIGS. 7A to 7D relate to the method for manufacturing the OLED device shown in FIG. 4, whereby the same reference numbers will be used throughout the drawings to refer to the same or like parts. Hereinafter, the method for manufacturing the OLED device according to one embodiment of the present invention will be described with reference to FIGS. 6 and 7A to 7D.

Figure 7A:
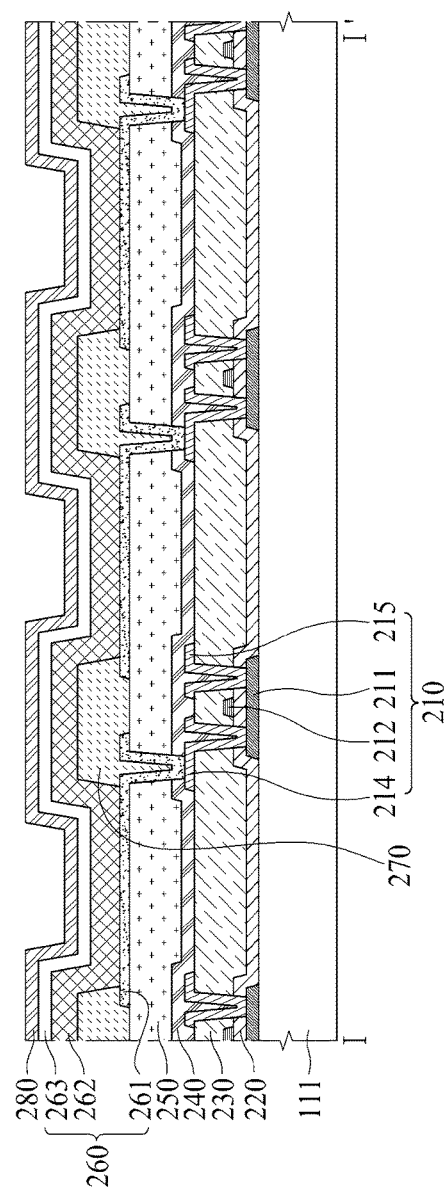
FIGS. 7A to 7D are cross sectional views illustrating the method for manufacturing the OLED device according to one embodiment of the present disclosure.

First, as shown in FIG. 7A, the thin film transistors 210, the organic light emitting devices 260, and the photo-reactive organic film 280 are provided, as indicated in S101 of FIG. 6.

In detail, before forming the thin film transistor 210, the buffer film may be provided on the first substrate 111 so as to protect the thin film transistor 210 and the organic light emitting device 260 from the moisture permeating through the first substrate 111 which is vulnerable to the moisture. The buffer film may be formed of the plurality of inorganic films deposited alternately. For example, the buffer film may be formed in a multi-layered structure by alternately depositing at least one inorganic film from a silicon oxide film (SiOx), a silicon nitride film (SiNx), and silicon oxynitride (SiON). The buffer film may be formed by a chemical vapor deposition (CVD) method.

Thereafter, the active layer 211 of the thin film transistor 210 is provided on the buffer film. In detail, an active metal layer is provided on an entire surface of the buffer film by sputtering or metal organic chemical vapor deposition (MOCVD) method, and then the active metal layer is patterned by a mask process using a photoresist pattern, to thereby form the active layer 211. The active layer 211 may be formed of a silicon-based semiconductor material or an oxide-based semiconductor material.

Then, the gate insulating film 220 is provided on the active layer 211. The gate insulating film 220 may be formed in a single-layered structure of the inorganic insulating material such as silicon oxide (SiOx) or silicon nitride (SiNx), or a multi-layered structure of the above silicon oxide (SiOx) and silicon nitride (SiNx).

Then, the gate electrode 212 of the thin film transistor 210 is provided on the gate insulating film 220. In detail, a first metal layer is provided on an entire surface of the gate insulating film 220 by sputtering or MOCVD method, and then the first metal layer is patterned by a mask process using a photoresist pattern, to thereby form the gate electrode 212. The gate electrode 212 may be formed in a single-layered structure or multi-layered structure among molybdenum (Mo), aluminum (Al), chrome (Cr), aurum (Au), titanium (Ti), nickel (Ni), neodymium (Nd), copper (Cu) and their alloys.

The insulating interlayer 230 is provided on the gate electrode 212. The insulating interlayer 230 may be formed in a single-layered structure of the inorganic insulating material such as silicon oxide (SiOx) or silicon nitride (SiNx), or a multi-layered structure of the above silicon oxide (SiOx) and silicon nitride (SiNx).

Then, the contact holes for exposing the active layer 211 are provided through the gate insulating film 220 and the insulating interlayer 230.

The source and drain electrodes 214 and 215 of the thin film transistor 210 are provided on the insulating interlayer 230. In detail, a second metal layer is provided on an entire surface of the insulating interlayer 230 by sputtering or MOCVD method. Then, the second metal layer is patterned by a mask process using a photoresist pattern. Each of the source and drain electrodes 214 and 215 may be connected with the active layer 211 via the contact hole penetrating through the gate insulating film 220 and the insulating interlayer 230. Each of the source and drain electrodes 214 and 215 may be formed in a single-layered structure or multi-layered structure among molybdenum (Mo), aluminum (Al), chrome (Cr), aurum (Au), titanium (Ti), nickel (Ni), neodymium (Nd), copper (Cu) and their alloys.

Then, the protection film 240 is provided on the source and drain electrodes 214 and 215 of the thin film transistor 210. The protection film 240 may be formed in a single-layered structure of the inorganic insulating material such as silicon oxide (SiOx) or silicon nitride (SiNx), or a multi-layered structure of the above silicon oxide (SiOx) and silicon nitride (SiNx). The protection film 240 may be formed by the CVD method.

Then, the planarization film 250 may be provided on the protection film 240 so as to planarize the step difference area caused by the thin film transistor 210. The planarization film 250 may be formed of an organic material, for example, acryl resin, epoxy resin, phenolic resin, polyamide resin, polyimide resin, and etc.

Then, the first electrode 261 of the organic light emitting device 260 is provided on the planarization film 250. In detail, a third metal film is provided on an entire surface of the planarization film 250 by sputtering or MOCVD method, and then the third metal film is patterned by a mask process using a photoresist pattern, to thereby provide the first electrode 261. The first electrode 261 may be connected with the source electrode 214 of the thin film transistor 210 via the contact hole penetrating through the protection film 240 and the planarization film 250. The first electrode 261 may be formed of a metal material with high reflectance, and more particularly, a deposition structure of aluminum and titanium (Ti/Al/Ti), a deposition structure of aluminum and Indium Tin Oxide (ITO/AL/ITO), an APC alloy, and a deposition structure of APC alloy and Indium Tin Oxide (ITO/APC/ITO).

Then, the bank 270 is provided to cover the edge of the first electrode 261 on the planarization film 250, to thereby divide the subpixels (P1, P2, P3). The bank 270 may be formed of an organic material, for example, acryl resin, epoxy resin, phenolic resin, polyamide resin, polyimide resin, and etc.

Then, the organic light emitting layer 262 is provided on the first electrode 261 and the bank 270 by a deposition process or solution process. The organic light emitting layer 262 is a common layer provided on the subpixels (P1, P2, P3) in common. In this case, the organic light emitting layer may be a white light emitting layer for emitting white light.

If the organic light emitting layer 262 is the white light emitting layer, it may have a tandem structure of 2 stacks or more than 2 stacks. Each stack may include a hole transporting layer, at least one light emitting layer, and an electron transporting layer.

Between each of the stacks, there may be a charge generation layer. The charge generation layer may include an n-type charge generation layer positioned adjacent to the lower stack, and a p-type charge generation layer provided on the n-type charge generation layer and positioned adjacent to the upper stack. The n-type charge generation layer injects the electron into the lower stack, and the p-type charge generation layer injects the hole into the upper stack. The n-type charge generation layer may be formed of an organic layer doped with alkali metal such as lithium (Li), natrium (Na), kalium (K) or cesium (Cs), or alkali earth metal such as magnesium (Mg), strontium (Sr), barium (Ba) or radium (Ra). The P-type charge generation layer may be formed of an organic layer obtained by doping an organic host material having a hole transporting capacity with dopant.

The second electrode 263 is provided on the organic light emitting layer 262. The second electrode 263 may be a common layer provided on the subpixels (P1, P2, P3) in common. The second electrode 263 may be formed of a transparent metal material (transparent conductive material, TCO) capable of transmitting light therethrough, for example, Indium Tin Oxide (ITO) or Indium Zinc Oxide (IZO). The second electrode 263 may be formed of a physical vapor deposition method such as sputtering. The capping layer may be provided on the second electrode 263.

Then, the photo-reactive organic film 280 is provided on the second electrode 263. The photo-reactive organic film 280 may be a common layer provided on the subpixels (P1, P2, P3) in common. The photo-reactive organic film 280 includes diarylethene molecules, as shown in FIG. 5, whereby it has the photo-isomerization properties. As shown in FIG. 5, if the diarylethene molecules are irradiated with ultraviolet rays (hereinafter, referred to as "UV"), its structure is changed from an open-ring structure into a close-ring structure. Meanwhile, if the diarylethene molecules are irradiated with visible rays (hereinafter, referred to as "VR"), its structure is changed from the close-ring structure into the open-ring structure.

If the diarylethene molecules have the open-ring structure, the photo-reactive organic film 280 has a hydrophobic property by a large amount of fluorine. Thus, if the diarylethene molecules have the open-ring structure, an adhesion property between the photo-reactive organic film 280 and the metal film is not good so that it is difficult to deposit the metal film on the photo-reactive organic film 280.

If the diarylethene molecules have the close-ring structure, the fluorine molecules in the surface of the photo-reactive organic film 280 are arranged inside the photo-reactive organic film 280. Thus, the surface of the photo-reactive organic film 280 has a hydrophilic property, whereby the metal film is easily deposited on the photo-reactive organic film 280.

Figure 7B:
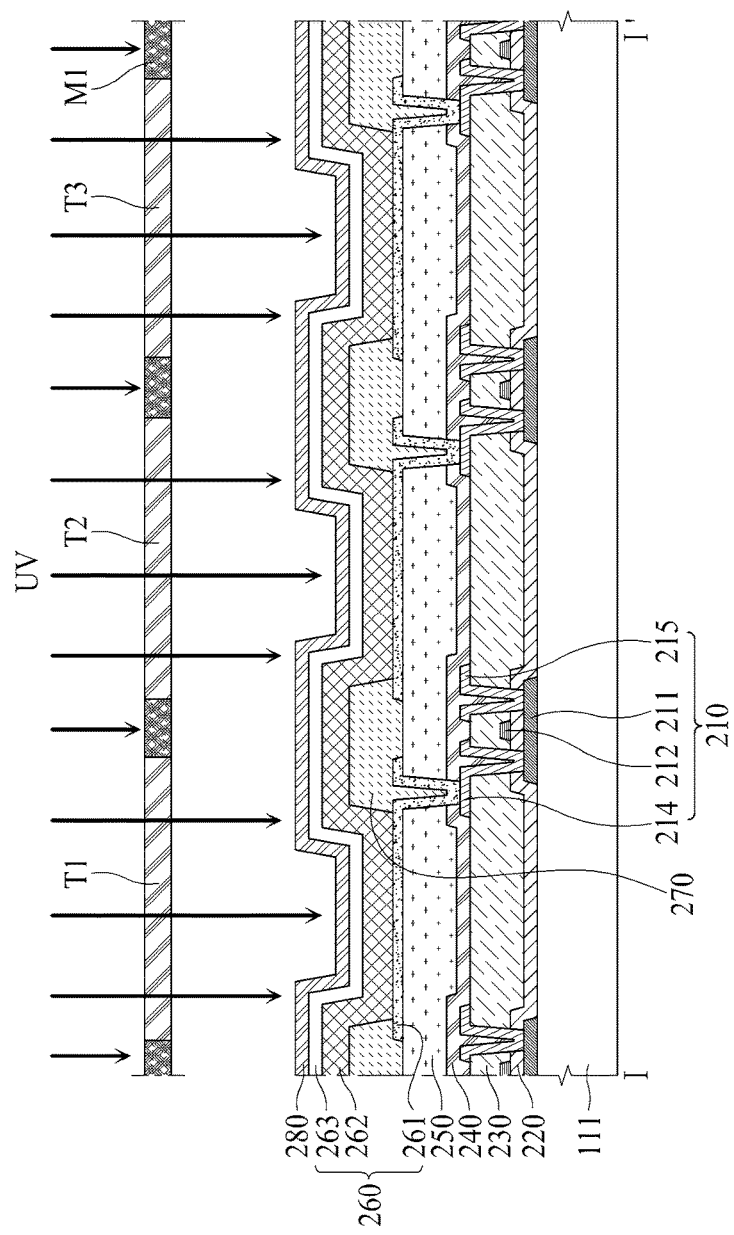

Second, as shown in FIG. 7B, the photo-reactive organic film 280 is irradiated with UV under a first mask (M1) having transmitting portions (T1, T2, T3) with different UV transmittances, as indicated in S102 of FIG. 6.

In detail, the first mask (M1) is provided with the first transmitting portion (T1) having the first UV transmittance, the second transmitting portion (T2) having the second UV transmittance which is higher than the first UV transmittance, and the third transmitting portion (T3) having the third UV transmittance which is higher than the second UV transmittance. The photo-reactive organic film 280 is irradiated with UV under the first mask (M1). For example, the first transmitting portion (T1) is positioned above the first subpixel (P1), the second transmitting portion (T2) is positioned above the second subpixel (P2), and the third transmitting portion (T3) is positioned above the third subpixel (P3). In this case, the amount of UV irradiation for the third subpixel (P3) is the largest, and the amount of UV irradiation for the first subpixel (P1) is the smallest.

Figure 7C:
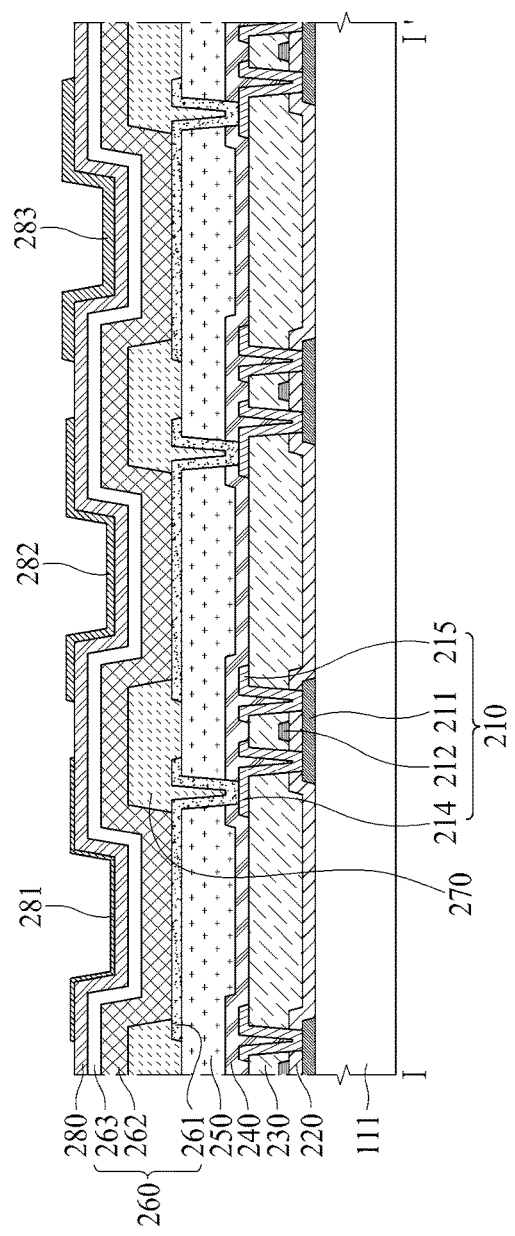

Third, as shown in FIG. 7C, the first optical auxiliary layer 281 having a first thickness is provided in the first subpixel (P1), the second optical auxiliary layer 282 having a second thickness is provided in the second subpixel (P2), and the third optical auxiliary layer 283 having a third thickness is provided in the third subpixel (P3), as indicated in S103 of FIG. 6.

In detail, the metal film is deposited only on the area irradiated with UV, and the metal film is not deposited on the area which is not irradiated with UV. Accordingly, even though an open mask having a transmitting portion for the display area is used instead of a mask having transmitting portions for the first to third subpixels (P1, P2, P3), the first to third optical auxiliary layers 281, 282, and 283 may be deposited on the photo-reactive organic film 280 of the first to third subpixels (P1, P2, P3) irradiated with UV. That is, the first optical auxiliary layer 281 may be deposited on the first subpixel (P1), the second optical auxiliary layer 282 may be deposited on the second subpixel (P2), and the third optical auxiliary layer 283 may be deposited on the third subpixel (P3).

Also, it is possible to adjust the thickness of the metal film deposited on the photo-reactive organic film 280 in accordance with the amount of UV irradiation. As the amount of UV irradiation is increased, the thickness of the metal film deposited on the photo-reactive organic film 280 becomes thicker. The amount of UV irradiation applied to the third subpixel (P3) is the largest, and the amount of UV irradiation applied to the first subpixel (P1) is the smallest. Thus, as shown in FIG. 7C, the thickness of the third optical auxiliary layer 283 deposited on the third subpixel (P3) is the largest, and the thickness of the first optical auxiliary layer 281 deposited on the first subpixel (P1) is the smallest. Due to the difference in the amount of UV irradiation between the first transmitting portion T1, the second transmitting portion T2, and the third transmitting portion T3, the hydrophobicity of a first portion of the photo-reactive organic film 280 below the first optical auxiliary layer 281 may be larger than a hydrophobicity of a second portion of the photo-reactive organic film 280 below the second optical auxiliary layer 282. The hydrophobicity of the second portion of the photo-reactive organic film 280 may be larger than a hydrophobicity of a third portion of the photo-reactive organic film 280 below the third optical auxiliary layer 283. The hydrophobicity of the first portion, the second portion, and the third portion of the organic film 280 may be smaller than a portion of the organic film 280 that does not overlap with the optical auxiliary layers 281, 282, and 283. As the hydrophobicity of the photo-reactive organic film 280 is larger, the photo-reactive organic film 280 may not be mixed with water. In this case, the contact angle of a water droplet on the surface of the photo-reactive organic film 280 may exceed 90°. If the contact angle of the water droplet exceeds 150°, the photo-reactive organic film 280 may have a super-hydrophobic surface. As the hydrophilicity of the photo-reactive organic film 280 is larger, the photo-reactive organic film 280 may be mixed with water. In this case, the contact angle of the water droplet on the surface of the photo-reactive organic film 280 may not exceed 90°. If the contact angle of the water droplet does not exceed 20°, the photo-reactive organic film 280 may have a super-hydrophilic surface. The hydrophobicity of the photo-reactive organic film 280 may be measured by the contact angle of the water droplet on the surface of the photo-reactive organic film 280.

As described above, the first optical auxiliary layer 281 of the first subpixel (P1), the second optical auxiliary layer 282 of the second subpixel (P2), and the third optical auxiliary layer 283 of the third subpixel (P3) may have the different thicknesses from one another by adjusting the amount of UV irradiation applied to the first to third subpixels (P1, P2, P3). Thus, it is possible to optimize the micro-cavity distance in each of the first to third subpixels (P1, P2, P3).

Figure 7D:
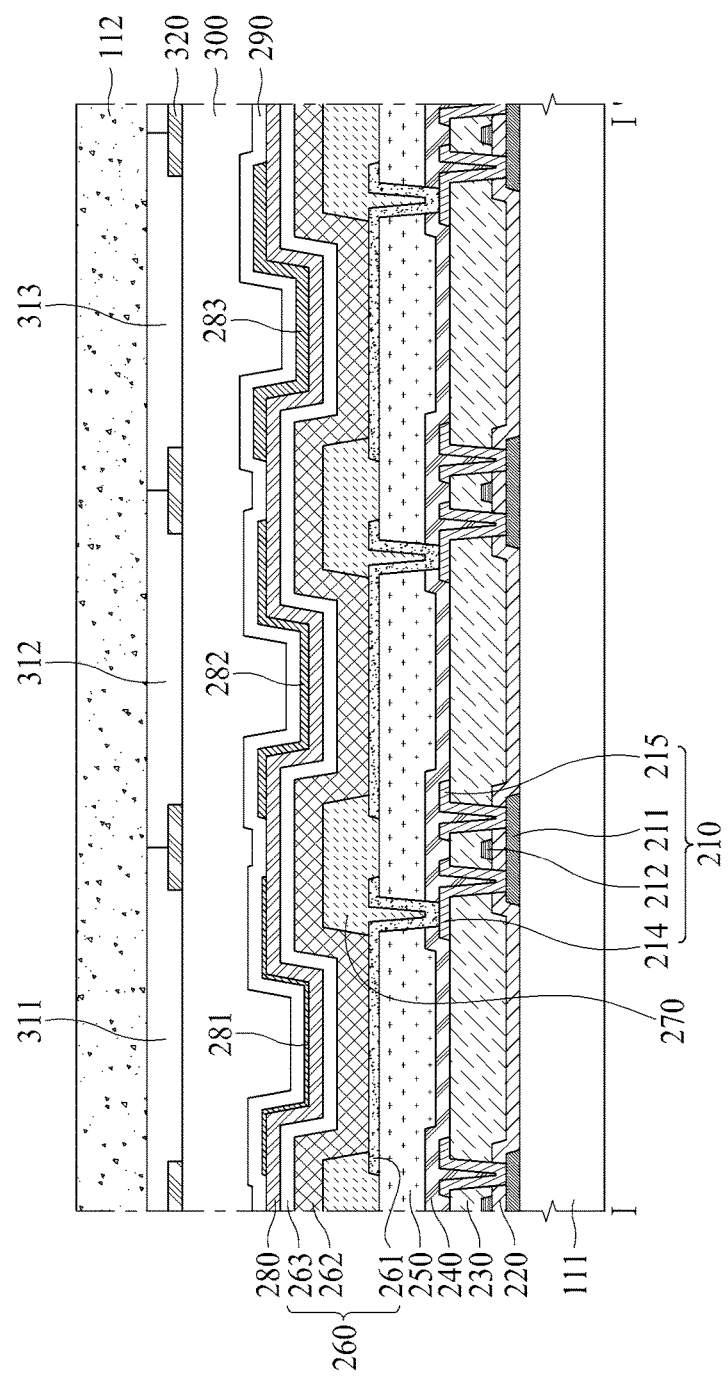

Fourth, as shown in FIG. 7D, the semi-transmissive electrode 290 and the encapsulation film 300 are provided on the photo-reactive organic film 280, and the first to third optical auxiliary layers 281, 282, and 283, as indicated in S104 of FIG. 6.

In detail, the semi-transmissive electrode 290 is provided on the photo-reactive organic film 280, and the first to third optical auxiliary layers 281, 282, and 283. The semi-transmissive electrode 290 may be formed of a semi-transmissive conductive material such as magnesium (Mg), argentums (Ag), or alloy of magnesium (Mg) and argentums (Ag).

Then, the encapsulation film 300 is provided on the semi-transmissive electrode 290. The encapsulation film 300 may prevent a permeation of oxygen or moisture into the organic light emitting layer 262 and the second electrode 263. The encapsulation film 300 may include at least one inorganic film. The inorganic film may be formed of silicon nitride, aluminum nitride, zirconium nitride, titanium nitride, hafnium nitride, tantalum nitride, silicon oxide, aluminum oxide, or titanium oxide.

Also, the encapsulation film 300 may further include at least one organic film. The organic film may be formed at a thickness enough to prevent particles from getting into the organic light emitting layer 262 and the second electrode 263 through the encapsulation film 300.

The black matrix 320 and the color filters 311, 312, and 313 are provided on the encapsulation film 300. If the black matrix 320 and the color filters 311, 312, and 313 are directly provided on the encapsulation film 300, there is no need for an alignment process when the first and second substrates 111 and 112 are bonded to each other, whereby it is possible to reduce the thickness of the display panel since there is no need for the additional adhesion layer, in comparison to a case of forming the black matrix 320 and the color filters 311, 312, and 313 on the second substrate 112, and bonding to the first and second substrates 111 and 112 to each other.

The color filters 311, 312, and 313 may be disposed in the respective subpixels (P1, P2, P3). For example, as shown in FIG. 7D, the first color filter 311 is disposed in the first subpixel (P1), the second color filter 312 is disposed in the second subpixel (P2), and the third color filter 313 is disposed in the third subpixel (P3).

The overcoat layer may be provided on the color filters 311, 312, and 313 so as to planarize the step difference area caused by the color filters 311, 312, and 313 and the black matrix 320.

Then, the second substrate 112 is attached onto the color filters 311, 312, and 313. The second substrate 112 may be a plastic film, a glass substrate, or an encapsulation film (protection film).

As described above, under the condition that the mask is disposed on the photo-reactive organic film 280, the photo-reactive organic film 280 is irradiated with UV by the use of first mask (M1) having transmitting portions with different UV transmittances so that the thickness of the first optical auxiliary layer 281 of the first subpixel (P1), the thickness of the second optical auxiliary layer 282 of the second subpixel (P2), and the thickness of the third optical auxiliary layer 283 of the third subpixel (P3) may be different from one another. As a result, it is possible to optimize the micro-cavity distance in each of the first to third subpixels (P1, P2, P3) by the three processes including the deposition process of the photo-reactive organic film 280, the UV irradiation process, and the deposition process of the metal film. Accordingly, it is possible to largely reduce the number of manufacturing processes, to thereby simplify the manufacturing process, and to reduce a manufacturing cost.

Figure 8:
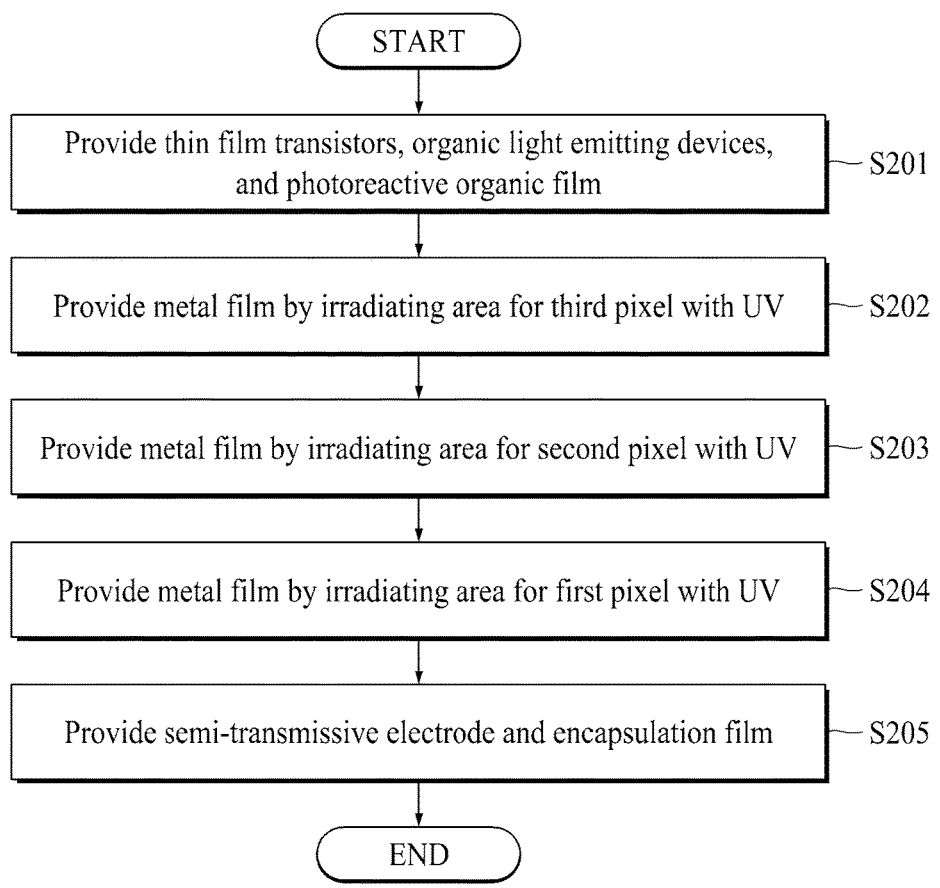
FIG. 8 is a flow chart illustrating a method for manufacturing an OLED device according to another embodiment of the present disclosure.

FIG. 8 is a flow chart illustrating a method for manufacturing an OLED device according to another embodiment of the present disclosure. FIGS. 9A to 9H are cross sectional views illustrating the method for manufacturing the OLED device according to another embodiment of the present disclosure.

The cross sectional views shown in FIGS. 9A to 9H relate to the method for manufacturing the above OLED device shown in FIG. 4, whereby the same reference numbers will be used throughout the drawings to refer to the same or like parts. Hereinafter, the method for manufacturing the OLED device according to another embodiment of the present disclosure will be described in detail with reference to FIG. 8 and FIGS. 9A to 9H.

Figure 9A:
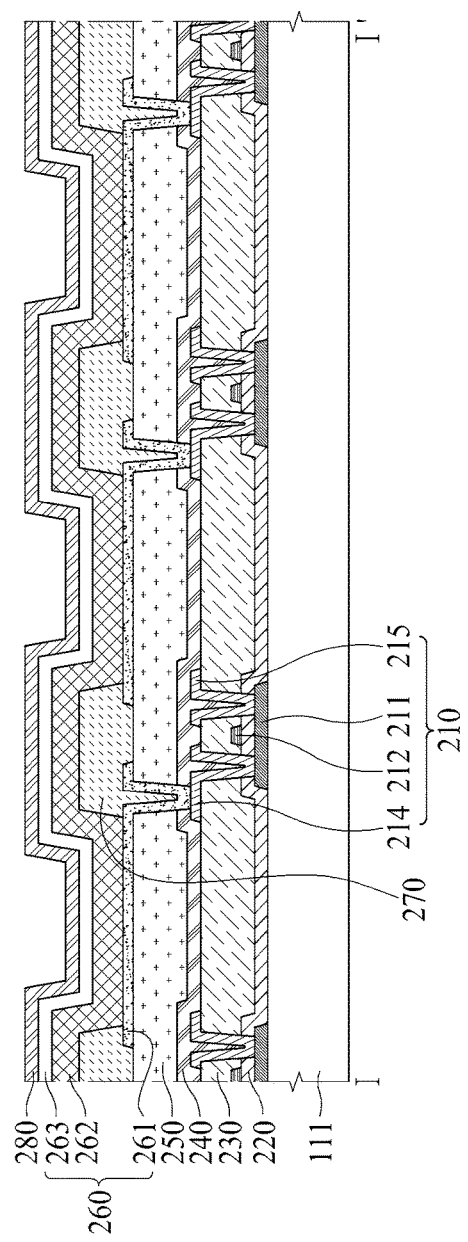
FIGS. 9A to 9H are cross sectional views illustrating the method for manufacturing the OLED device according to another embodiment of the present disclosure.

First, as shown in FIG. 9A, the thin film transistors 210, the organic light emitting devices 260, and the photo-reactive organic film 280 are provided, as indicated in S201 of FIG. 8.

The step S201 of FIG. 8 is the same as the step S101 of FIG. 6, whereby a detailed description for the step S201 of FIG. 8 will be omitted ('S201' of FIG. 8) for sake of brevity.

Figure 9B:
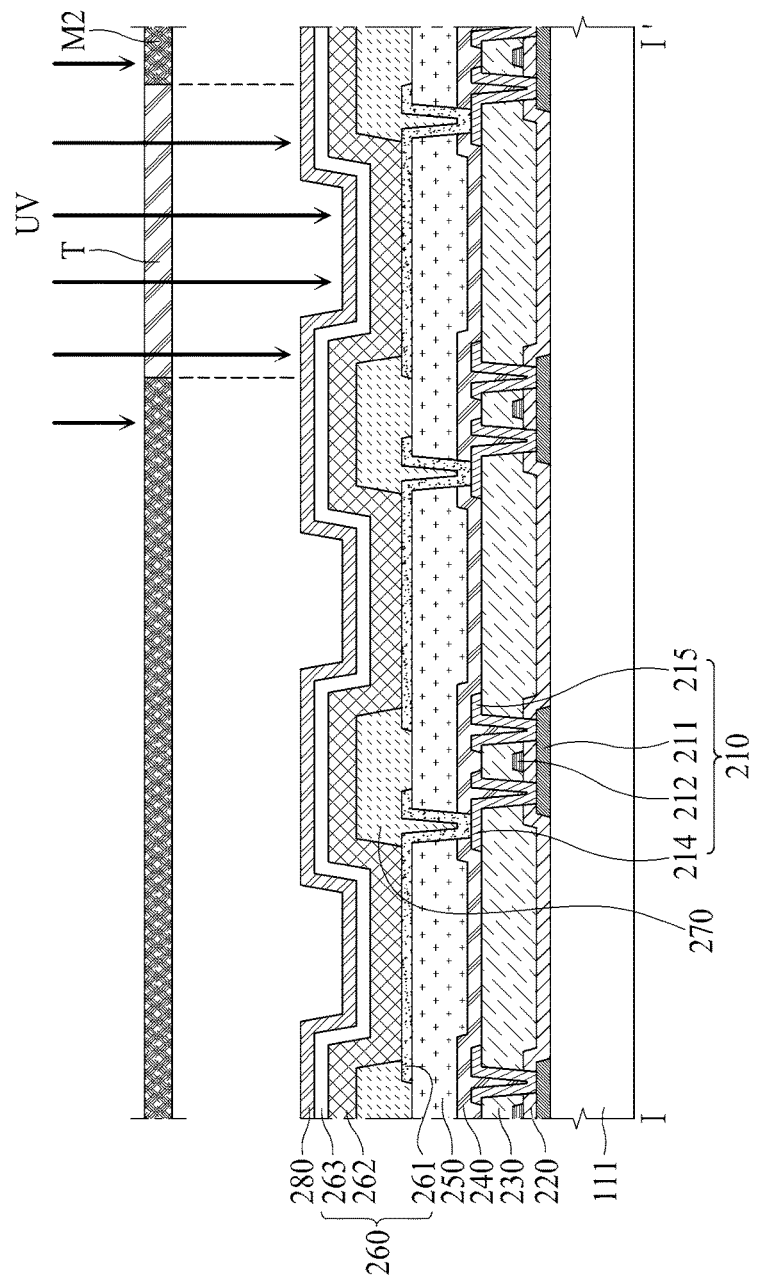
Figure 9C:
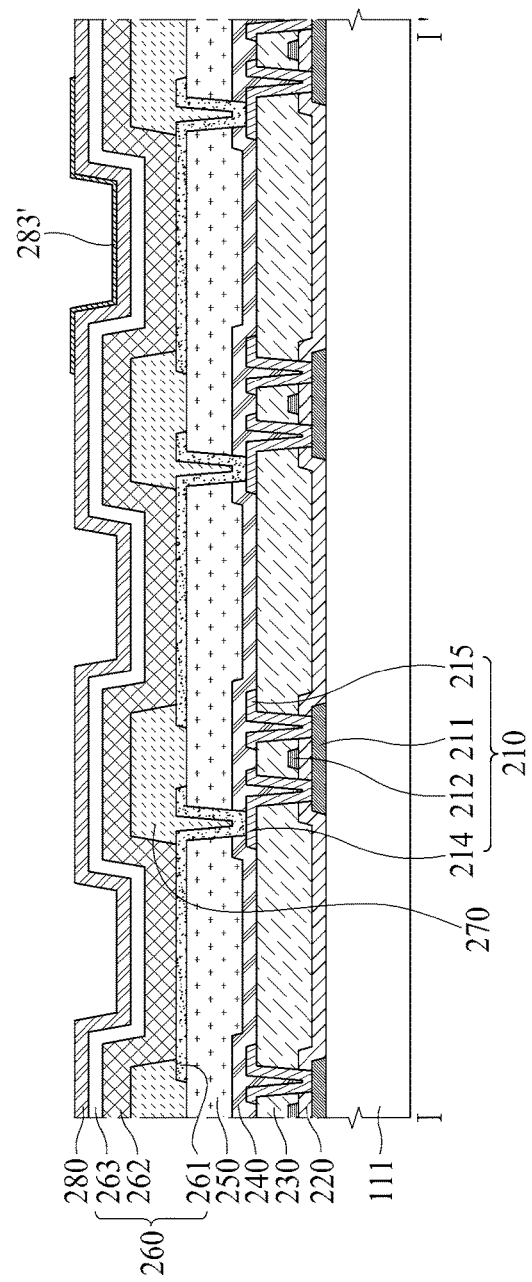

Second, as shown in FIGS. 9B and 9C, a metal film 283' is formed by irradiating the area for the third subpixel (P3) with UV, as indicated in S202 of FIG. 8.

In detail, as shown in FIG. 9B, under the condition that a second mask (M2) having a transmitting portion (T) is disposed on the photo-reactive organic film 280, the photo-reactive organic film 280 is irradiated with UV. In this case, the transmitting portion (T) is positioned above the area for the third subpixel (P3). The first and second subpixels (P1, P2) are not irradiated with UV, and only the third subpixel (P3) is irradiated with UV.

As shown in FIG. 5, the photo-reactive organic film 280 includes diarylethene molecules. Thus, the metal film is deposited only on the area of the photo-reactive organic film 280 which is irradiated with UV, and the metal film is not deposited on the area of the photo-reactive organic film 280 which is not irradiated with UV. Accordingly, even though an open mask having a transmitting portion for the display area is used instead of a mask having transmitting portions for the third subpixel (P3), the metal film 283' may be deposited only on the third subpixel (P3).

Figure 9D:
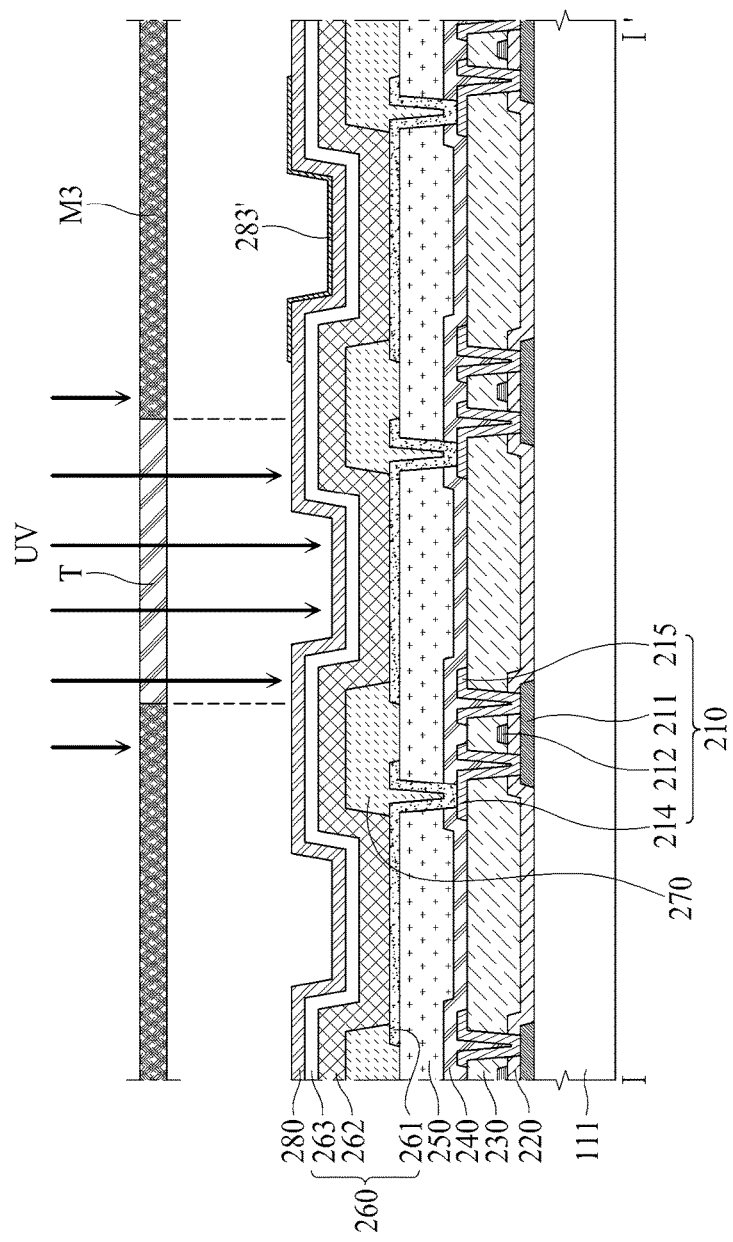
Figure 9E:
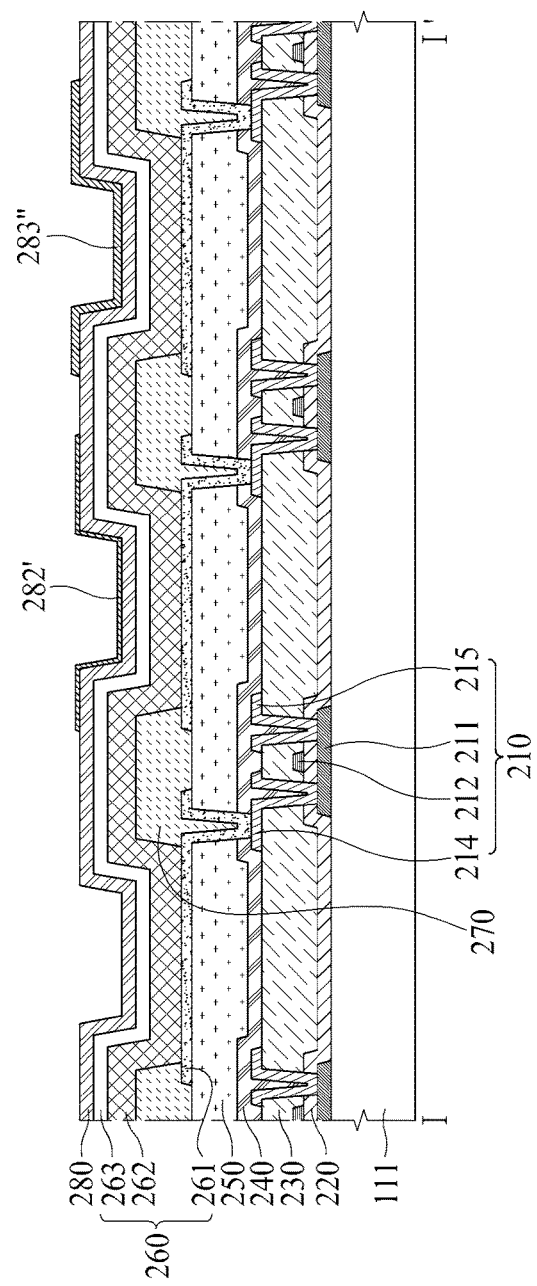

Third, as shown in FIGS. 9D and 9E, the area for the second subpixel (P2) is irradiated with UV, to thereby form metal films 282' and 283", as indicated in S203 of FIG. 8.

In detail, as shown in FIG. 9D, under the condition that a third mask (M3) having a transmitting portion (T) is disposed on the photo-reactive organic film 280, the photo-reactive organic film 280 is irradiated with UV. In this case, the transmitting portion (T) is positioned above the area for the second subpixel (P2). The first and third subpixels (P1, P3) are not irradiated with UV, and only the second subpixel (P2) is irradiated with UV.

As shown in FIG. 5, the photo-reactive organic film 280 includes diarylethene molecules. Thus, the metal film is deposited only on the area of the photo-reactive organic film 280 which is irradiated with UV, and the metal film is not deposited on the area of the photo-reactive organic film 280 which is not irradiated with UV. Accordingly, even though an open mask having a transmitting portion for the display area is used instead of a mask having transmitting portions for the second and third subpixels (P2, P3), as shown in FIG. 9E, the metal films 282' and 283" may be deposited on the second and third subpixels (P2, P3) irradiated with UV.

Figure 9F:
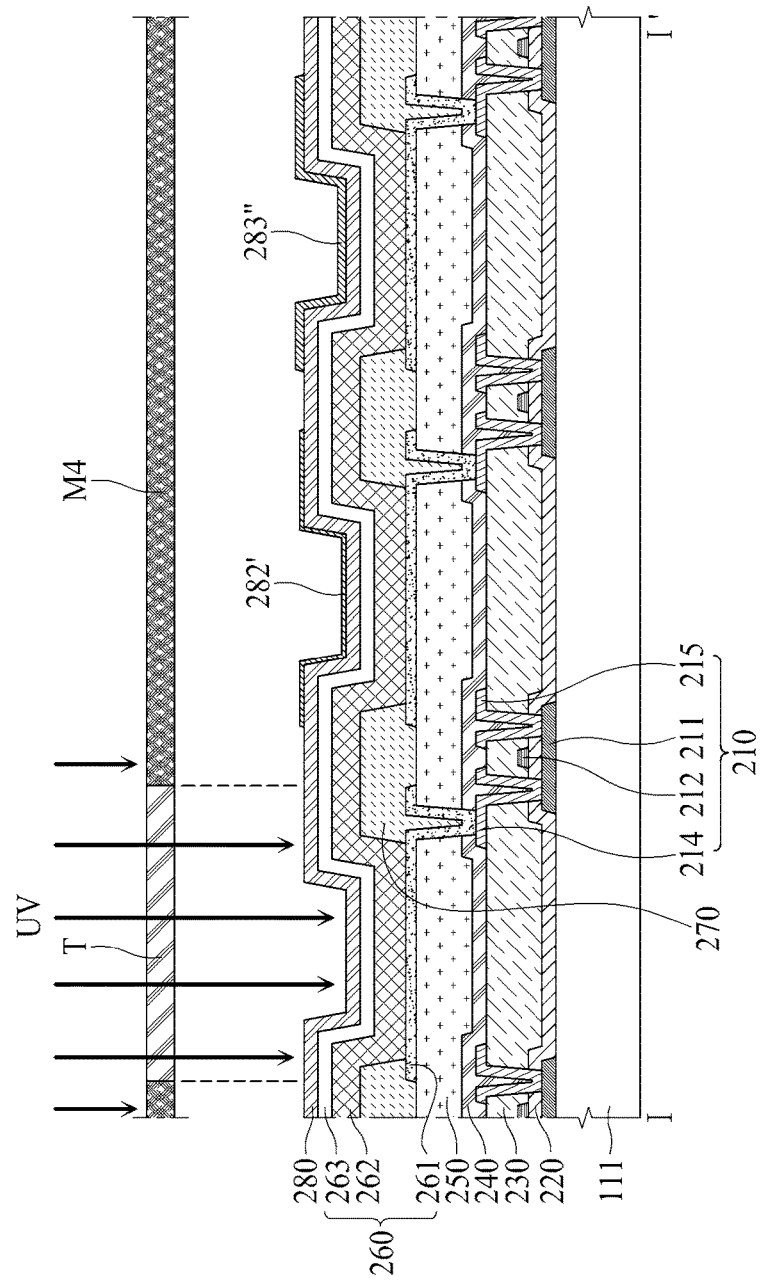
Figure 9G:
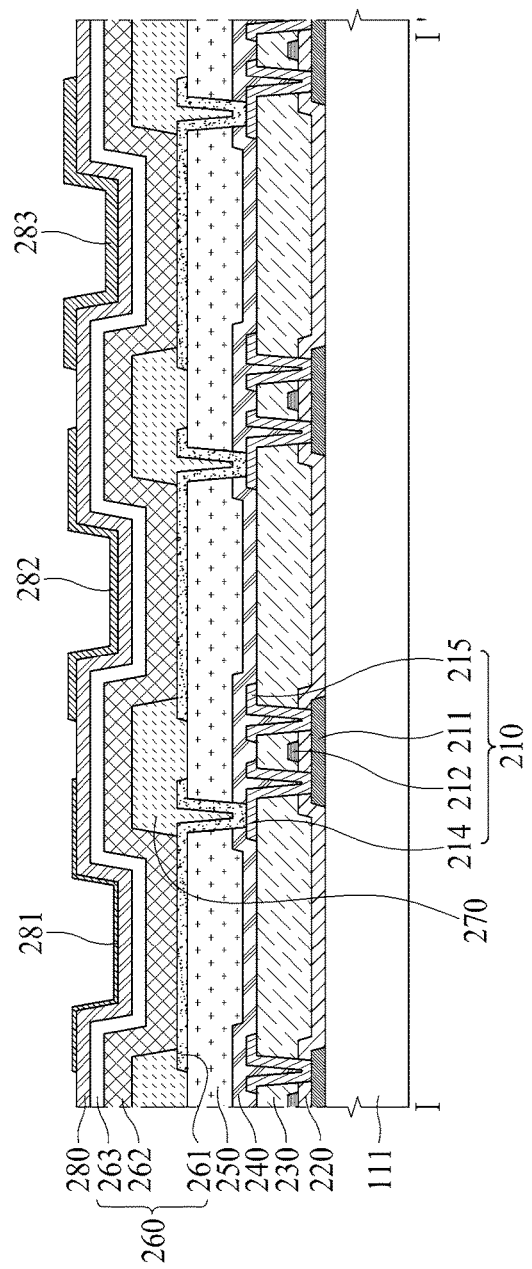

Fourth, as shown in FIGS. 9F and 9G, the area for the first subpixel (P1) is irradiated with UV, to thereby form the first to third optical auxiliary layers 281, 282, and 283, as indicated in S204 of FIG. 8.

In detail, as shown in FIG. 9F, under the condition that a fourth mask (M4) having a transmitting portion (T) is disposed on the photo-reactive organic film 280, the photo-reactive organic film 280 is irradiated with UV. In this case, the transmitting portion (T) is positioned above the area for the first subpixel (P1). The second and third subpixels (P2, P3) are not irradiated with UV, and only the first subpixel (P1) is irradiated with UV.

As shown in FIG. 5, the photo-reactive organic film 280 includes diarylethene molecules. Thus, the metal film is deposited only on the area of the photo-reactive organic film 280 which is irradiated with UV, and the metal film is not deposited on the area of the photo-reactive organic film 280 which is not irradiated with UV. Accordingly, even though an open mask having a transmitting portion for the display area is used instead of a mask having transmitting portions for the first to third subpixels (P1, P2, P3), as shown in FIG. 9G, the first to third optical auxiliary layers 281, 282, and 283 may be deposited on the first to third subpixels (P1, P2, P3) irradiated with UV. When the transmittance of the second mask M2, third mask M3, and the fourth mask M4 are substantially similar, a hydrophobicity of a first portion of the photo-reactive organic film 280 below the first optical auxiliary layer 281, a hydrophobicity of a second portion of the photo-reactive organic film 280 below the second optical auxiliary layer 282, and a hydrophobicity of a third portion of the photo-reactive organic film 280 below the third optical auxiliary layer 283 may be substantially same with one another. As the hydrophobicity of the photo-reactive organic film 280 is larger, the photo-reactive organic film 280 may not be mixed with water. In this case, the contact angle of a water droplet on the surface of the photo-reactive organic film 280 may exceed 90°. If the contact angles of the water droplet exceeds 150°, the photo-reactive organic film 280 may have super-hydrophobic surface. As the hydrophilicity of the photo-reactive organic film 280 is larger, the photo-reactive organic film 280 may be mixed with water. In this case, the contact angle of the water droplet on the surface of the photo-reactive organic film 280 may not exceed 90°. If the contact angles of the water droplet does not exceed 20°, the photo-reactive organic film 280 may have super-hydrophilic surface. The hydrophobicity of the photo-reactive organic film 280 may be measured by the contact angle of the water droplet on the surface of the photo-reactive organic film 280. The hydrophobicity of the first portion, the second portion, and the third portion of the photo-reactive organic film 280 may be smaller than a hydrophobicity of a portion of the organic film 280 that does not overlap with the optical auxiliary layers 281, 282, and 283.

Meanwhile, the metal film is deposited on the photo-reactive organic film 280 of the third subpixel (P3) by the steps of S202, S203, and S204, the metal film is deposited on the photo-reactive organic film 280 of the second subpixel (P2) by the steps of S203 and S204, and the metal film is deposited on the photo-reactive organic film 280 of the first subpixel (P1) by the steps of S204. Accordingly, the third optical auxiliary layer 283 of the third subpixel (P3) has the largest thickness, and the first optical auxiliary layer 281 of the first subpixel (P1) has the smallest thickness. That is, the thickness of the first optical auxiliary layer 281, the thickness of the second optical auxiliary layer 282, and the thickness of the third optical auxiliary layer 283 may be different from one another.

Figure 9H:
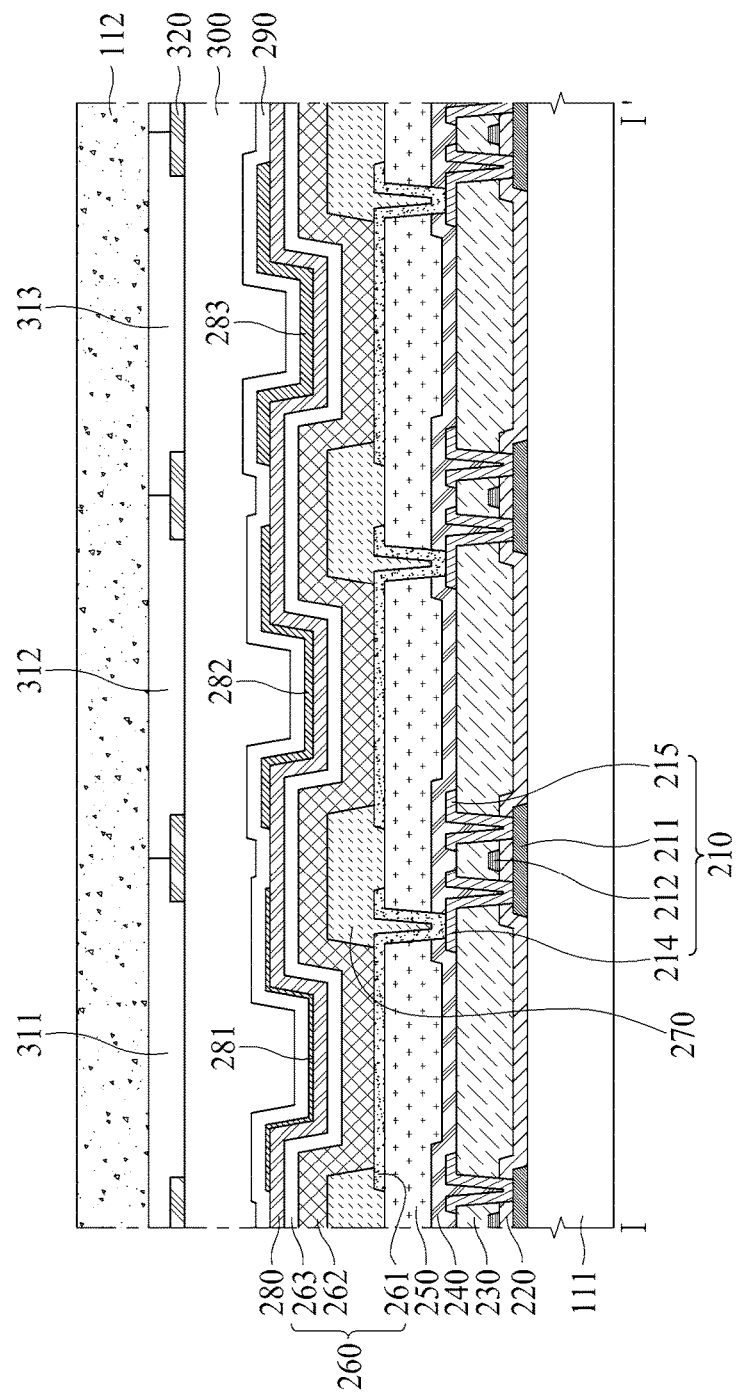

Fifth, as shown in FIG. 9H, the semi-transmissive electrode 290 and the encapsulation film 300 are provided on the photo-reactive organic film 280, and the first to third optical auxiliary layers 281, 282, and 283, as indicated in S205 of FIG. 8.

The step S205 of FIG. 8 is the same as the step S104 of FIG. 6, whereby a detailed description for the step S205 of FIG. 8 will be omitted ('S205' of FIG. 8) for the sake of brevity.

As described above, after the metal film 283' is deposited by irradiating the area for the third subpixel (P3) with UV, the metal film 282' and 283" is deposited by irradiating the area for the second subpixel (P2) with UV, and then the first to third optical auxiliary layers 281, 282, and 283 are deposited by irradiating the area for the first subpixel (P1) with UV. As a result, the thickness of the first optical auxiliary layer 281 in the first subpixel (P1), the thickness of the second optical auxiliary layer 282 in the second subpixel (P2), and the thickness of the third optical auxiliary layer 283 in the third subpixel (P3) may be different from one another. As a result, it is possible to optimize the microcavity distance in each of the first to third subpixels (P1, P2, P3) by the seven processes including the deposition process of the photo-reactive organic film 280, the three UV irradiation processes, and the three deposition processes of the metal film. Accordingly, it is possible to largely reduce the number of manufacturing processes, to simplify the manufacturing process, and to reduce a manufacturing cost.

Figure 10:
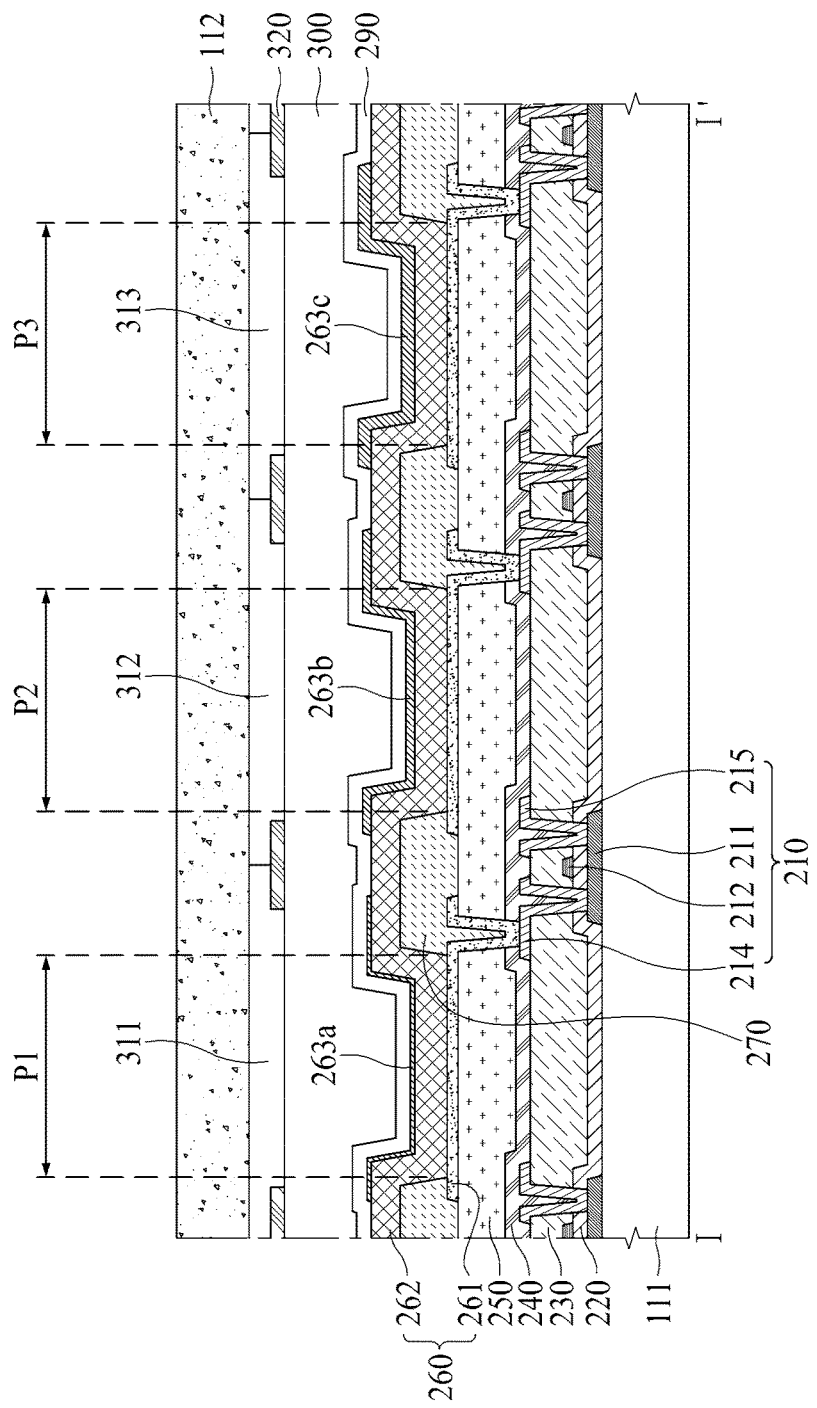
FIG. 10 is a cross sectional view showing another example along I-I' of FIG. 3 according to another embodiment of the present disclosure.

FIG. 10 is a cross sectional view showing another example along I-I' of FIG. 3 according to an embodiment of the present disclosure.

Except that the second electrodes 263a, 263b, and 263c of the first to third subpixels (P1, P2, P3) have the different thicknesses instead of the first to third optical auxiliary layers 281, 282, and 283, the cross sectional view shown in FIG. 10 is identical to the above cross sectional view shown in FIG. 4. In FIG. 10, a detailed description for the first substrate 111, the thin film transistor 210, the gate insulating film 220, the insulating interlayer 230, the protection film 240, the planarization film 250, the first electrodes 261, the bank 270, the encapsulation film 300, the color filters 311, 312, and 313, the black matrix 320, and the second substrate 112 will be omitted for the sake of brevity.

Figure 11:
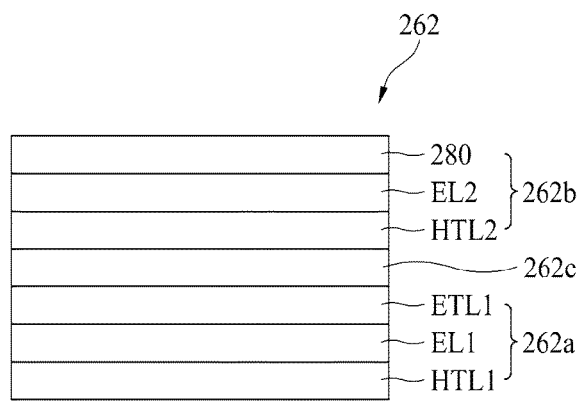
FIG. 11 illustrates one example of an organic light emitting layer of FIG. 10.

Referring to FIG. 10, the organic light emitting layer 262 is provided on the first electrode 261 and the bank 270. The organic light emitting layer 262 is a common layer provided on the subpixels (P1, P2, P3) in common. The organic light emitting layer 262 may be a white light emitting layer for emitting white light. In this case, the organic light emitting layer 262 may have a tandem structure of 2 stacks or more than 2 stacks, as shown in FIG. 11. FIG. 11 shows that the organic light emitting layer 262 includes two stacks 262a and 262b, but not limited to this structure. That is, the organic light emitting layer 262 may include three or more stacks. Between the stacks 262a and 262b, there is a charge generation layer 262c. Each subpixel may include a corresponding part of the organic light emitting layer 262 disposed on the first electrode 261 of the subpixel. Thus, the first subpixel P1 may include at least a first part of the organic light emitting layer 262 on the first electrode 261 of the first subpixel P1, the second subpixel P2 may include at least a second part of the organic light emitting layer 262 on the first electrode 261 of the second subpixel P2, and the third subpixel P3 may include at least a third part of the organic light emitting layer 262 on the first electrode 261 of the third subpixel P3.

Referring to FIG. 11, the first stack 262a includes a first hole transporting layer (HTL1), a first light emitting layer (EL1), and a first electron transporting layer (ETL1). The second stack 262b includes a second hole transporting layer (HTL2), a second light emitting layer (EL2), and the photo-reactive organic film 280.

The first hole transporting layer (HTL1) transfers the hole injected from the first electrode 261 to the first light emitting layer (EL1). The second hole transporting layer (HTL2) transfers the hole injected from the charge generation layer 262c to the second light emitting layer (EL2). Each of the first hole transporting layer (HTL1) and the second hole transporting layer (HTL2) may be formed of NPD(N,N-dinaphthyl-N,N'-diphenyl benzidine), TPD(N,N'-bis-(3-methylphenyl)-N,N'-bis-(phenyl)-benzidine), TCTA(4-(9H-carbazol-9-yl)-N,N-bis[4-(9H-carbazol-9-yl)phenyl]-benzenamine), CBP(4,4'-N,N'-dicarbazole-biphenyl), s-TAD, or MTDATA(4,4',4"-Tris(N-3-methylphenyl-N-phenyl-amino)-triphenylamine), but not limited to these materials.

Each of the first light emitting layer (EL1) and the second light emitting layer (EL2) includes host and dopant. Also, each of the first light emitting layer (EL1) and the second light emitting layer (EL2) may include a material for emitting predetermined-colored light, which may be formed of a phosphorescent or fluorescent material.

If each of the first light emitting layer (EL1) and the second light emitting layer (EL2) is an organic light emitting layer for emitting red light, it may include a host material of CBP(carbazole biphenyl) or mCP(1,3-bis(carbazol-9-yl), and may include a phosphorescent material having dopant with at least any one selected among PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium), and PtOEP(octaethylporphyrin platinum), or a fluorescent material having dopant with PBD:Eu(DBM)3(Phen) or Perylene, but not limited to these materials.

If each of the first light emitting layer (EL1) and the second light emitting layer (EL2) is an organic light emitting layer for emitting green light, it may include a host material of CBP or mCP, and may include a phosphorescent material having dopant with Ir(ppy)3(fac tris(2-phenylpyridine) iridium), or a fluorescent material having dopant with Alq3 (tris(8-hydroxyquinolino)aluminum), but not limited to these materials.

If each of the first light emitting layer (EL1) and the second light emitting layer (EL2) is an organic light emitting layer for emitting blue light, it may include a host material of CBP or mCP, and may include a phosphorescent material having dopant with (4,6-F2ppy)2Irpic or L2BD111, but not limited to these materials.

Each of the first light emitting layer (EL1) and the second light emitting layer (EL2) may emit yellow light, magenta light, or blue-green light in addition to the red light, the blue light, and the green light.

The first electron transporting layer (ETL1) is disposed on the organic light emitting layer 262c, wherein the first electron transporting layer (ETL1) transfers the electron injected from the second electrode 263 to the organic light emitting layer 262c. The first electron transporting layer (ETL1) may be formed of PBD(2-(4-biphenyl)-5-(4-tert-butylphenyl)-1,3,4-oxadiazole), TAZ(3-(4-biphenyl)-4-phenyl-5-tertbutylphenyl-1,2,4-triazole), Liq(8-hydroxyquinolinato-lithium), BAlq(Bis(2-methyl-8-quinolinolate)-4-(phenylphenolato)aluminium), or TPBi(2,2',2'-(1,3,5-benzinetriyl)-tris(1-phenyl-1-H-benzimidazole), but not limited to these materials.

The charge generation layer 262c may include an n-type charge generation layer positioned adjacent to the lower stack, and a p-type charge generation layer provided on the n-type charge generation layer and positioned adjacent to the upper stack. The n-type charge generation layer injects the electron into the lower stack, and the p-type charge generation layer injects the hole into the upper stack. The n-type charge generation layer may be formed of an organic layer obtained by doping an organic host material having an electron transporting capacity with alkali metal such as lithium (Li), natrium (Na), kalium (K) or cesium (Cs), or alkali earth metal such as magnesium (Mg), strontium (Sr), barium (Ba) or radium (Ra). The P-type charge generation layer may be formed of an organic layer obtained by doping an organic host material having a hole transporting capacity with dopant.

The first stack 262a further includes a first hole injecting layer between the first electrode 261 and the first hole transporting layer (HTL1), and may further include a first electron injecting layer between the first electron transporting layer (ETL1) and the second stack 262b. The second stack 262b further includes a second hole injecting layer between the charge generation layer 262c and the second hole transporting layer (HTL2), and may further include a second electron transporting layer between the second light emitting layer (EL2) and the photo-reactive organic film 280.

The photo-reactive organic film 280 is disposed on the organic light emitting layer 262c, wherein the photo-reactive organic film 280 transfers the electron injected from the second electrode 263 to the organic light emitting layer 262c. Also, the photo-reactive organic film 280 includes diarylethene molecules, as shown in FIG. 5, whereby it has the photo-isomerization properties. The photo-reactive organic film 280 may be formed of an electron transporting material including diarylethene molecules. As shown in FIG. 5, if the diarylethene molecules are irradiated with ultraviolet rays (hereinafter, referred to as "UV"), its structure is changed from an open-ring structure into a close-ring structure. Meanwhile, if the diarylethene molecules are irradiated with visible rays (hereinafter, referred to as "VR"), its structure is changed from the close-ring structure into the open-ring structure.

If the diarylethene molecules have the open-ring structure, the photo-reactive organic film 280 has a hydrophobic property by a large amount of fluorine. Thus, if the diarylethene molecules have the open-ring structure, an adhesion property between the photo-reactive organic film 280 and a conductive film, such as a metal film, is not good so that it is difficult to deposit the metal film on the photo-reactive organic film 280.

If the diarylethene molecules have the close-ring structure, the fluorine molecules in the surface of the photo-reactive organic film 280 are arranged inside the photo-reactive organic film 280. Thus, the surface of the photoreactive organic film 280 has a hydrophilic property, whereby the conductive film is easily deposited on the photo-reactive organic film 280.

If using the photo-isomerization properties in the diarylethene molecules of the photo-reactive organic film 280, the metal film may be selectively provided on predetermined areas. Accordingly, the areas of the first to third subpixels (P1, P2, P3) are irradiated with UV, it is possible to form the second electrodes 263a, 263b, and 263c for the first to third subpixels (P1, P2, P3). The second electrodes 263a, 263b, and 263c may contact the photo-reactive organic film 280 included in the organic light emitting layer 262. The second electrode 263a of the first subpixel P1, which is a first conductive film, may be disposed above the first part of the organic light emitting layer 262 in the first subpixel P1, the second electrode 263b of the second subpixel P2, which is a second conductive film, may be disposed above the second part of the organic light emitting layer 262 in the second subpixel P2, and the second electrode 263c of the third subpixel P3, which is a third conductive film, may be disposed above the third part of the organic light emitting layer 263 in the third subpixel P3.

Also, it is possible to adjust a thickness of the metal film deposited on the photo-reactive organic film 280 in accordance with an amount of UV irradiation. As the amount of UV irradiation is increased, the thickness of the metal film deposited on the photo-reactive organic film 280 becomes thicker. Thus, if the amount of UV irradiation applied to the area overlapped with the third subpixel (P3) is the largest, and the amount of UV irradiation applied to the area overlapped with the first subpixel (P1) is the smallest, the thickness of the second electrode 263c for the third subpixel (P3) is the largest, and the thickness of the second electrode 263a for the first subpixel (P1) is the smallest. That is, the second electrodes 263a, 263b, and 263c for the respective first to third subpixels (P1, P2, P3) may have the different thicknesses from one another.

The semi-transmissive electrode 290 is provided on the photo-reactive organic film 280, and the second electrodes 263a, 263b, and 263c. The semi-transmissive electrode 290 may be formed of a semi-transmissive conductive material such as magnesium (Mg), argentums (Ag), or alloy of magnesium (Mg) and argentums (Ag). Thus, a first part of the semi-transmissive electrode 290 may be disposed on the second electrode 263a of the first subpixel P1, a second part of the semi-transmissive electrode 290 may be disposed on the second electrode 263b of the second subpixel P2, and a third part of the semi-transmissive electrode 290 may be disposed on the second electrode 263c of the third subpixel P3.

According to the embodiment of the present disclosure, the first electrode 261 is formed of the metal material with high reflectance, and the semi-transmissive electrode 290 is formed of the semi-transmissive metal material, whereby it is possible to realize a micro-cavity structure by the first electrode 261 and the semi-transmissive electrode 290, to thereby improve an emission efficiency of light emitted from the organic light emitting layer 262.

According to the embodiment of the present disclosure, the second electrode 263a of the first subpixel (P1), the second electrode 263b of the second subpixel (P2), and the second electrode 263c of the third subpixel (P3) have the different thicknesses from one another, whereby it is possible to optimize a micro-cavity distance in each of the first to third subpixels (P1, P2, P3).

According to the embodiment of the present disclosure, the second electrode 263a of the first subpixel (P1) has the smallest thickness, and the second electrode 263c of the third subpixel (P3) has the largest thickness, but not limited to this structure. That is, the thickness in each of the second electrodes 263a, 263b, and 263c may be designed in an optimum range through a pretest in consideration of a wavelength of the light emitted from the subpixels, and a distance between the first electrode 261 and the semi-transmissive electrode 290.

Figure 12:
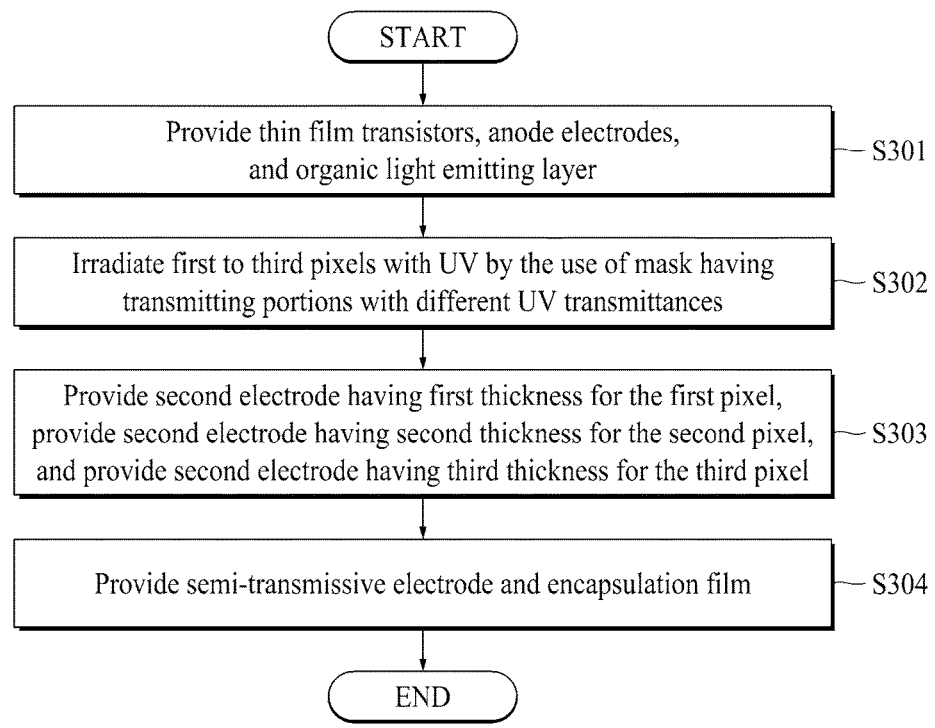
FIG. 12 is a flow chart illustrating a method for manufacturing an OLED device according to another embodiment of the present disclosure.

FIG. 12 is a flow chart illustrating a method for manufacturing an OLED device according to another embodiment of the present disclosure. FIGS. 13A to 13D are cross sectional views illustrating the method for manufacturing the OLED device according to another embodiment of the present disclosure.

The cross sectional views shown in FIGS. 13A to 13D relate to the method for manufacturing the above OLED device shown in FIG. 10, whereby the same reference numbers will be used throughout the drawings to refer to the same or like parts. Hereinafter, the method for manufacturing the OLED device according to another embodiment of the present invention will be described in detail with reference to FIG. 12 and FIGS. 13A to 13D.

Figure 13A:
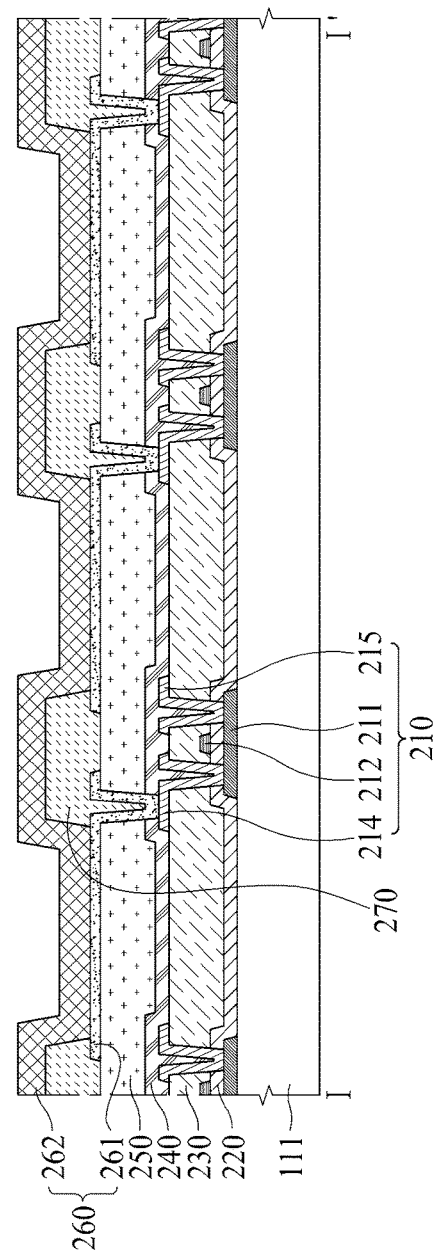
FIGS. 13A to 13D are cross sectional views illustrating the method for manufacturing the OLED device according to another embodiment of the present disclosure.

First, as shown in FIG. 13A, the thin film transistors 210, anode electrodes 261, and the organic light emitting layer 262 are provided, as indicated in S301 of FIG. 12.

The step S301 of FIG. 12, which is provided to form the thin film transistors 210 and the anode electrodes 261, is the same as the step S101 of FIG. 6, whereby a detailed description for the step S301 of FIG. 12 will be omitted.

The organic light emitting layer 262 is provided on the first electrode 261 and the bank 270 by a deposition process or solution process. The organic light emitting layer 262 is a common layer provided on the subpixels (P1, P2, P3) in common. In this case, the organic light emitting layer 262 may be a white light emitting layer for emitting white light.

If the organic light emitting layer 262 is the white light emitting layer, it may have a tandem structure of 2 stacks or more than 2 stacks. Between the stacks 261a and 261b, there is a charge generation layer 261c. As shown in FIG. 11, the first stack 262a includes a first hole transporting layer (HTL1), a first light emitting layer (EL1), and a first electron transporting layer (ETL1). The second stack 262b includes a second hole transporting layer (HTL2), a second light emitting layer (EL2), and the photo-reactive organic film 280.

The photo-reactive organic film 280 transfers the electron injected from the second electrode 263 to the organic light emitting layer 262c. Also, the photo-reactive organic film 280 includes diarylethene molecules, as shown in FIG. 5, whereby it has the photo-isomerization properties. The photo-reactive organic film 280 may be formed of an electron transporting material including diarylethene molecules. As shown in FIG. 5, if the diarylethene molecules are irradiated with ultraviolet rays (hereinafter, referred to as "UV"), its structure is changed from an open-ring structure into a close-ring structure. Meanwhile, if the diarylethene molecules are irradiated with visible rays (hereinafter, referred to as "VR"), its structure is changed from the close-ring structure into the open-ring structure.

If the diarylethene molecules have the open-ring structure, the photo-reactive organic film 280 has a hydrophobic property by a large amount of fluorine. Thus, if the diarylethene molecules have the open-ring structure, an adhesion property between the photo-reactive organic film 280 and the metal film is not good so that it is difficult to deposit the metal film on the photo-reactive organic film 280.

If the diarylethene molecules have the close-ring structure, the fluorine molecules in the surface of the photo-reactive organic film 280 are arranged inside the photo-reactive organic film 280. Thus, the surface of the photo-reactive organic film 280 has a hydrophilic property, whereby the metal film is easily deposited on the photo-reactive organic film 280.

Figure 13B:
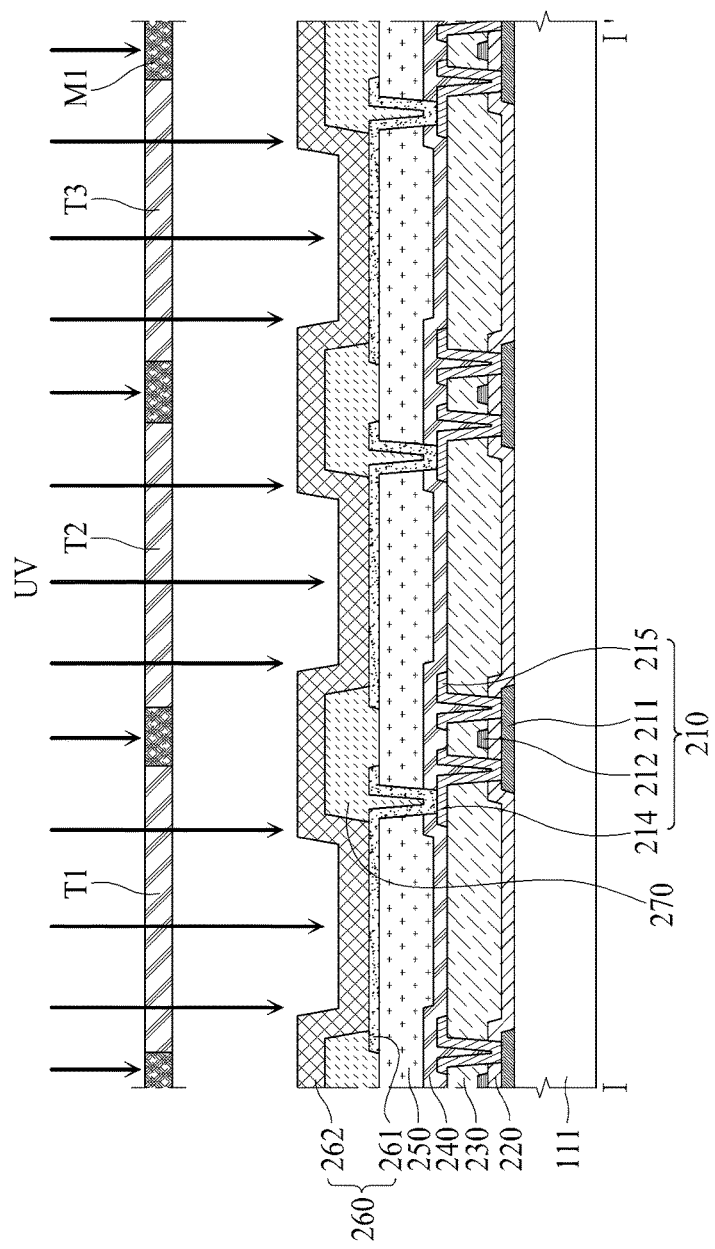

Second, as shown in FIG. 13B, the first to third subpixels (P1, P2, P3) are irradiated with UV by the use of first mask (M1) having transmitting portions (T1, T2, T3) with different UV transmittances, as indicated in S302 of FIG. 12.

In detail, the first mask (M1) is provided with the first transmitting portion (T1) having the first UV transmittance, the second transmitting portion (T2) having the second UV transmittance which is higher than the first UV transmittance, and the third transmitting portion (T3) having the third UV transmittance which is higher than the second UV transmittance. The organic light emitting layer 262 is irradiated with UV under the first mask (M1). For example, the first transmitting portion (T1) is positioned in the first subpixel (P1), the second transmitting portion (T2) is positioned in the second subpixel (P2), and the third transmitting portion (T3) is positioned in the third subpixel (P3). In this case, the amount of UV irradiation for the third subpixel (P3) is the largest, and the amount of UV irradiation for the first subpixel (P1) is the smallest.

Figure 13C:
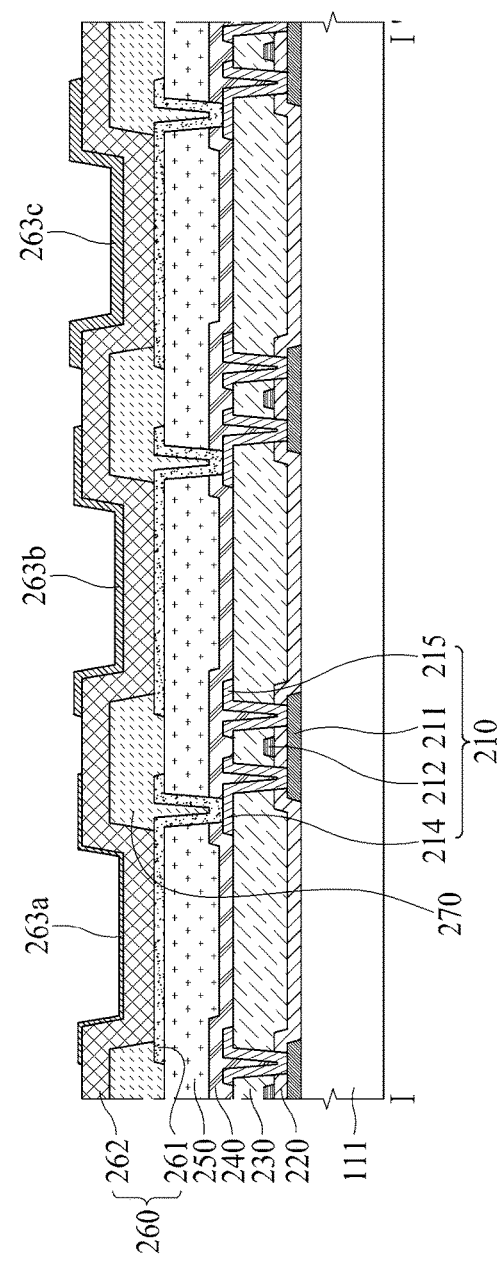

Third, as shown in FIG. 13C, the second electrode 263a of the first pixel P1 having a first thickness is provided in the first subpixel (P1), the second electrode 263b of the second pixel P2 having a second thickness is provided in the second subpixel (P2), and the second electrode 263c of the third pixel P3 having a third thickness is provided in the third subpixel (P3), as indicated in S303 of FIG. 12.

Also, it is possible to adjust a thickness in each of the second electrodes 263a, 263b, and 263c deposited on the photo-reactive organic film 280 of the organic light emitting layer 262 in accordance with an amount of UV irradiation. As the amount of UV irradiation is increased, the thickness of the second electrode deposited on the photo-reactive organic film 280 becomes thicker. Thus, the amount of UV irradiation applied to the third subpixel (P3) is the largest, and the amount of UV irradiation applied to the first subpixel (P1) is the smallest, whereby the thickness of the second electrode 263c for the third subpixel (P3) is the largest, and the thickness of the second electrode 263a for the first subpixel (P1) is the smallest, as shown in FIG. 13C. Due to the difference in the amount of UV irradiation between the first transmitting portion T1, the second transmitting portion T2, and the third transmitting portion T3, the hydrophobicity of a first portion of the photo-reactive organic film 280 below the second electrode 263a of the first subpixel P1 may be larger than a hydrophobicity of a second portion of the photo-reactive organic film 280 below the second electrode 263b of the second subpixel P2. The hydrophobicity of the second portion of the photo-reactive organic film 280 may be larger than a hydrophobicity of a third portion of the photo-reactive organic film 280 below the second electrode 263c of the third subpixel P3. The hydrophobicity of the first portion, the second portion, and the third portion of the photo-reactive organic film 280 may be smaller than a portion of the photo-reactive organic film 280 that does not overlap with the second electrodes 263a, 263b, and 263c.

As described above, the second electrode 263a of the first subpixel (P1), the second electrode 263b of the second subpixel (P2), and the second electrode 263c of the third subpixel (P3) may have the different thicknesses from one another by adjusting the amount of UV irradiation applied to the first to third subpixels (P1, P2, P3). Thus, it is possible to optimize the micro-cavity distance in each of the first to third subpixels (P1, P2, P3).

Figure 13D:
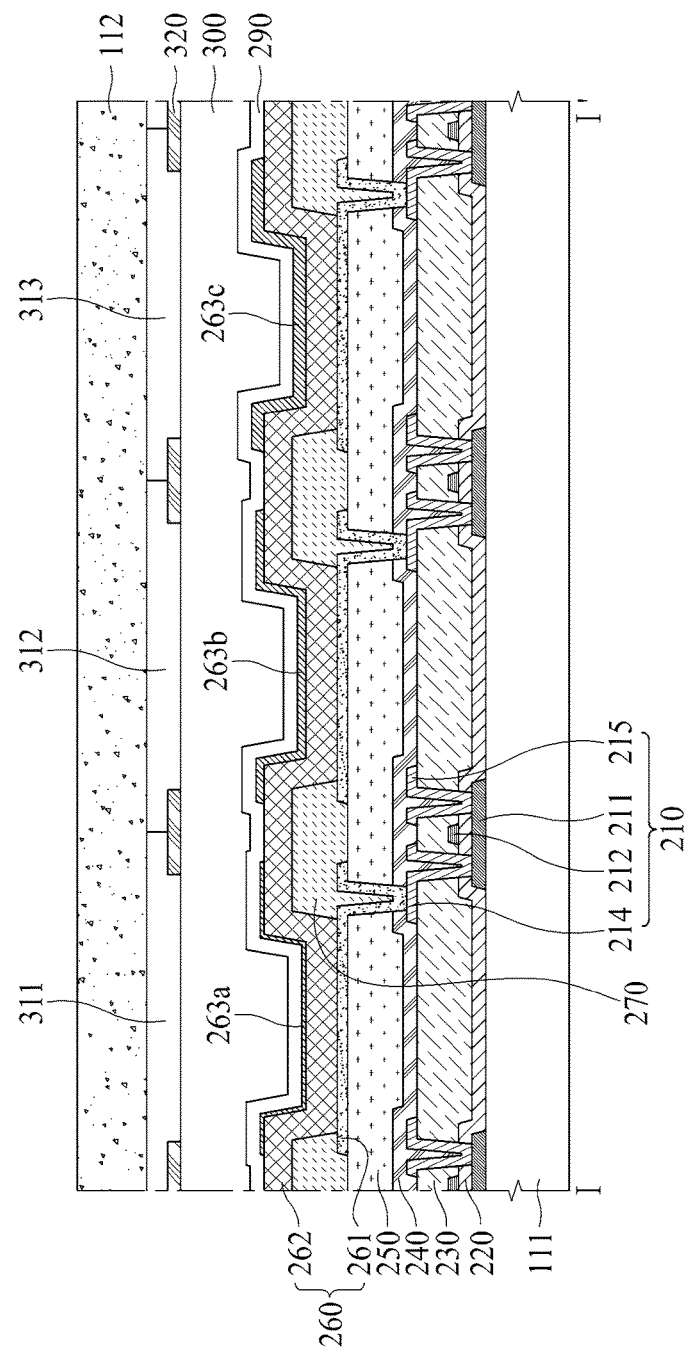

Fourth, as shown in FIG. 13D, the semi-transmissive electrode 290 and the encapsulation film 300 are provided on the photo-reactive organic film 280 of the organic light emitting layer 262, and the second electrodes 263a, 263b, and 263c, as indicated in S304 of FIG. 12.

The step S304 of FIG. 12 is the same as the step S104 of FIG. 6, whereby a detailed description for the step S304 of FIG. 12 will be omitted.

As described above, the electron transporting layer of the organic light emitting layer 262 is formed of the photoreactive organic film 280, and the second electrode 263a of the first subpixel (P1), the second electrode 263b of the second subpixel (P2), and the second electrode 263c of the third subpixel (P3) have the different thicknesses from one another by the use of first mask (M1) having transmitting portions (T1, T2, T3) with the different UV transmittances. As a result, it is possible to optimize the micro-cavity distance in each of the first to third subpixels (P1, P2, P3) by the two processes including the UV irradiation process, and deposition process of the metal film. Accordingly, it is possible to largely reduce the number of manufacturing processes, to simplify the manufacturing process, and to reduce a manufacturing cost.

Figure 14:
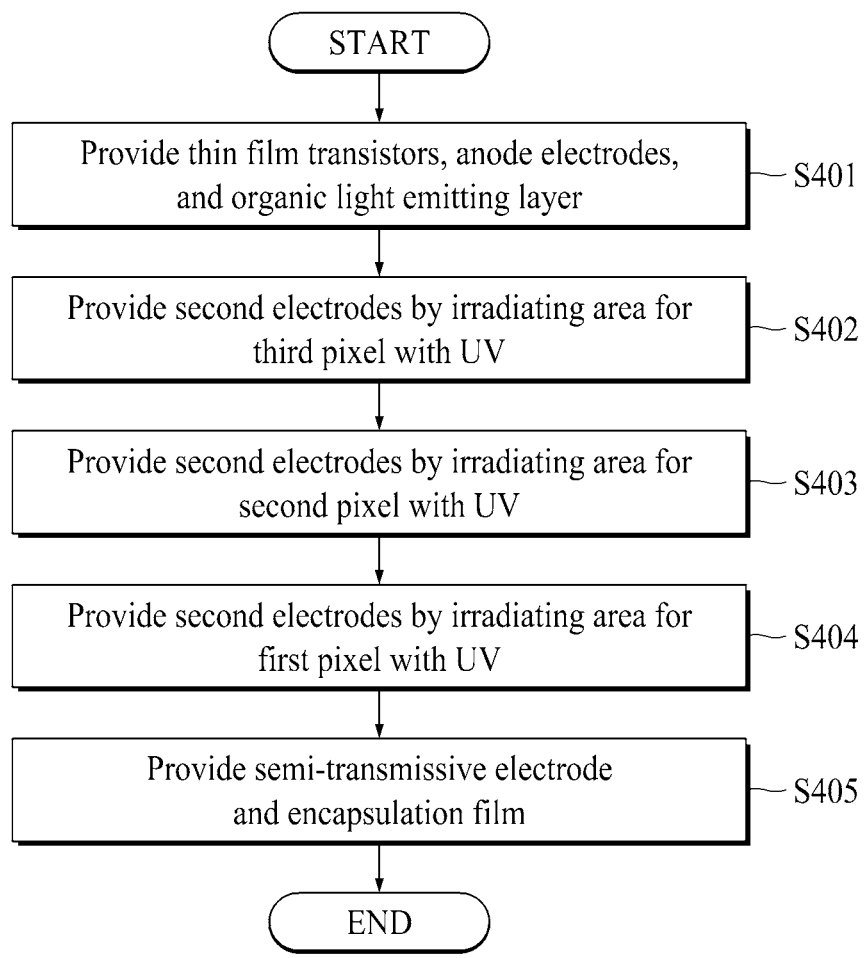
FIG. 14 is a flow chart illustrating a method for manufacturing an OLED device according to another embodiment of the present disclosure.

FIG. 14 is a flow chart illustrating a method for manufacturing an OLED device according to another embodiment of the present disclosure. FIGS. 15A to 15H are cross sectional views illustrating the method for manufacturing the OLED device according to another embodiment of the present disclosure.

The cross sectional views shown in FIGS. 15A to 15H relate to the method for manufacturing the above OLED device shown in FIG. 10, whereby the same reference numbers will be used throughout the drawings to refer to the same or like parts. Hereinafter, the method for manufacturing the OLED device according to another embodiment of the present invention will be described in detail with reference to FIG. 14 and FIGS. 15A to 15H.

Figure 15A:
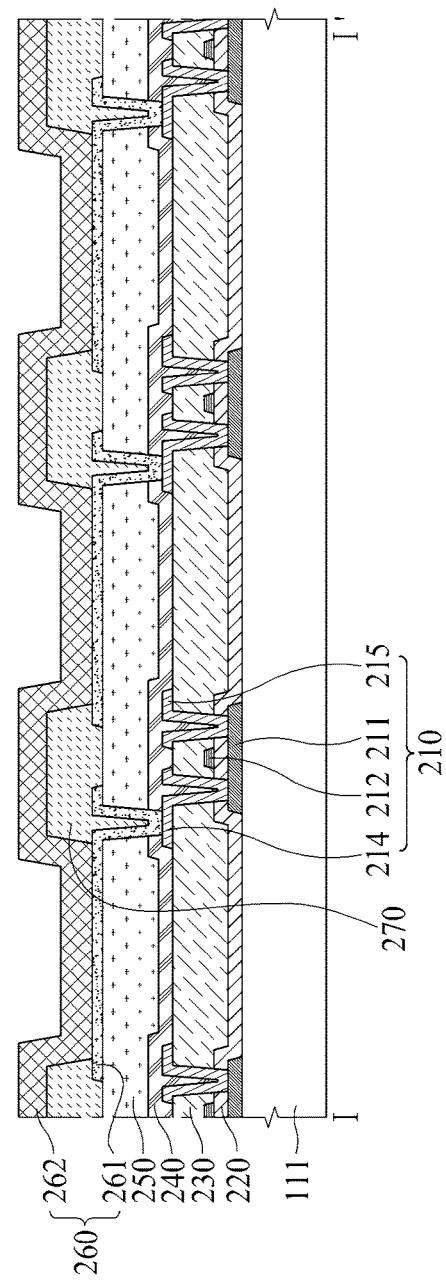

First, as shown in FIG. 15A, the thin film transistors 210, anode electrodes 261, and the organic light emitting layer 262 are provided, as indicated in S401 of FIG. 14.

The step S401 of FIG. 14 is the same as the step S301 of FIG. 12, whereby a detailed description for the step S401 of FIG. 14 will be omitted.

Figure 15B:
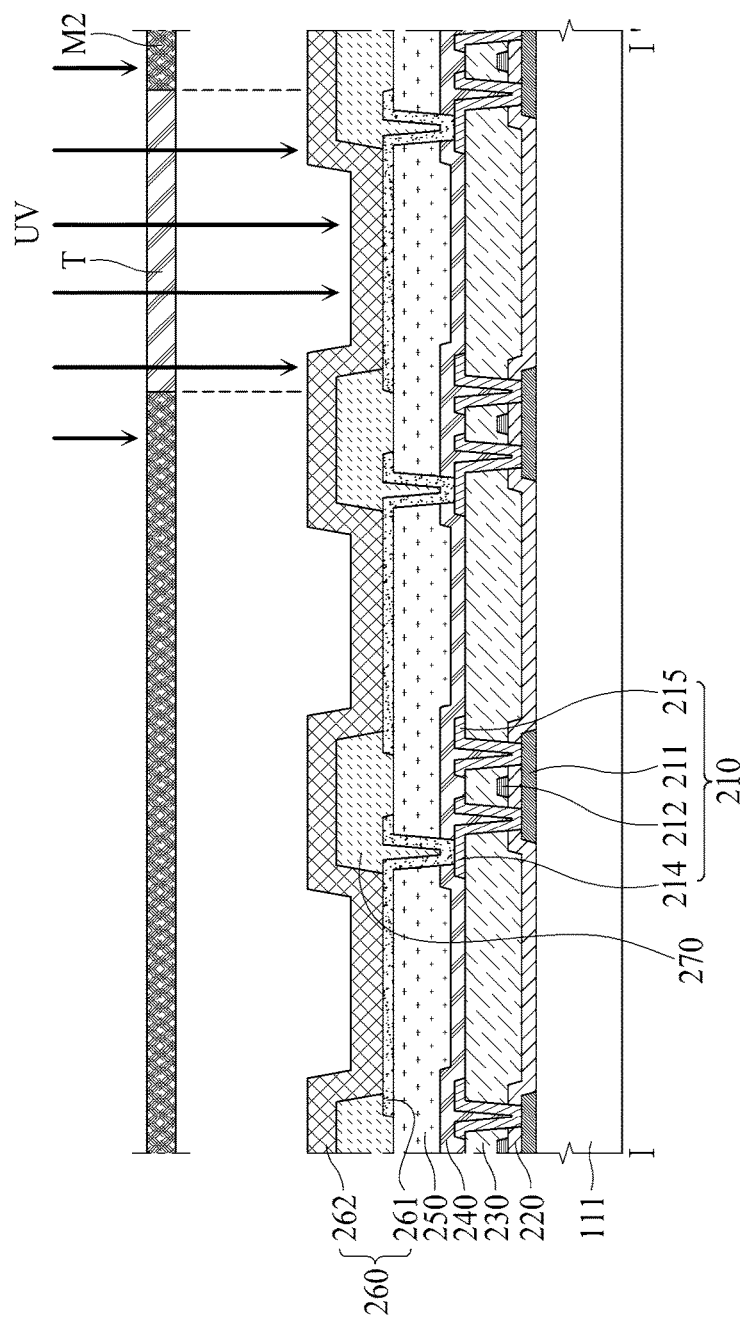
Figure 15C:
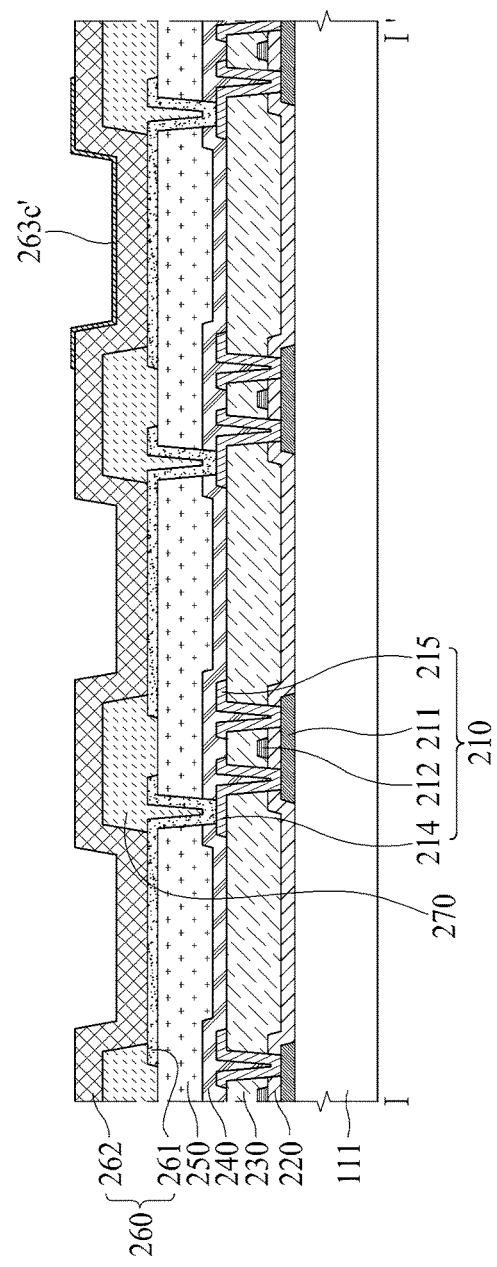

Second, as shown in FIGS. 15B and 15C, second electrodes 263c' are formed by irradiating the area for the third subpixel (P3) with UV, as indicated in S402 of FIG. 14.

In detail, as shown in FIG. 15B, under the condition that a second mask (M2) having a transmitting portion (T) is disposed on the organic light emitting layer 262, the organic light emitting layer 262 is irradiated with UV. In this case, the transmitting portion (T) is positioned in the area for the third subpixel (P3). The first and second subpixels (P1, P2) are not irradiated with UV, and only the third subpixel (P3) is irradiated with UV.

As shown in FIG. 5, the photo-reactive organic film 280 includes diarylethene molecules. Thus, the metal film is deposited only on the area of the photo-reactive organic film 280 which is irradiated with UV, and the metal film is not deposited on the area of the photo-reactive organic film 280 which is not irradiated with UV. Accordingly, even though an open mask having a transmitting portion for the display area is used instead of a mask having transmitting portions for the third subpixel (P3), as shown in FIG. 15C, the second electrode 263c' may be deposited only on the third subpixel (P3).

Figure 15D:
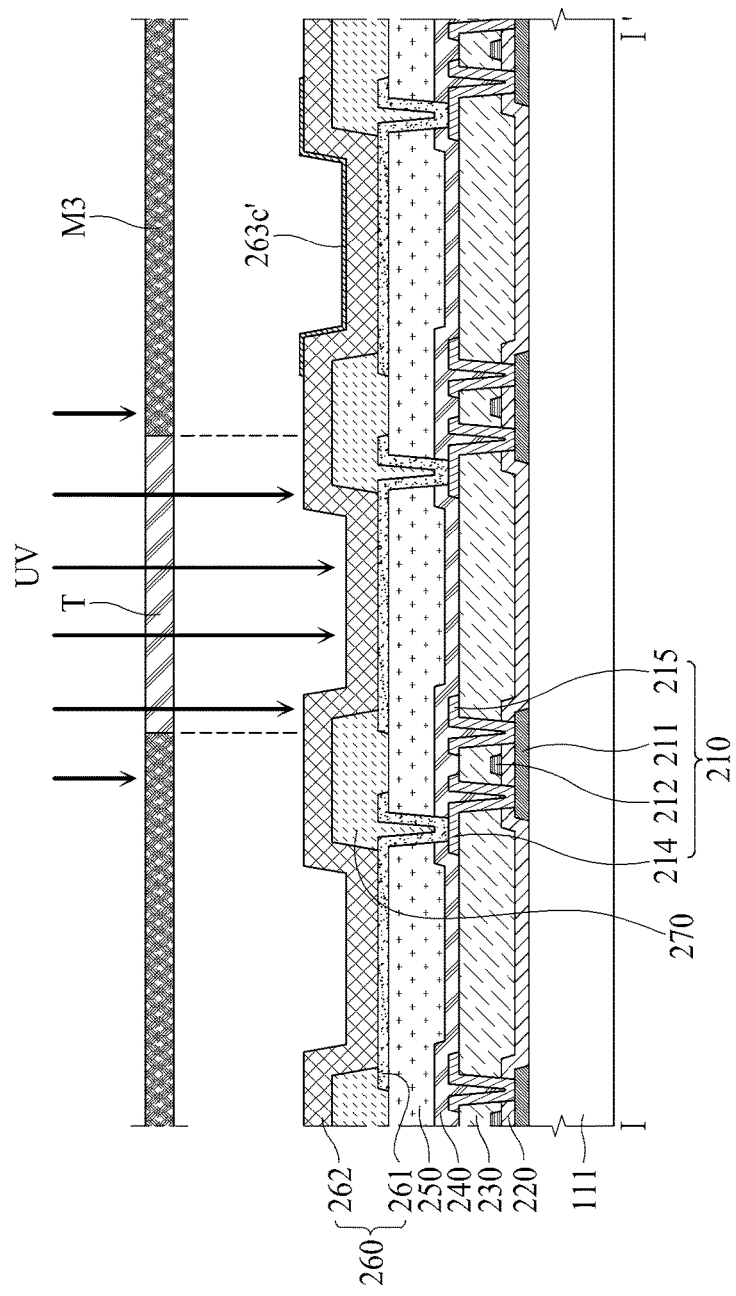
Figure 15E:
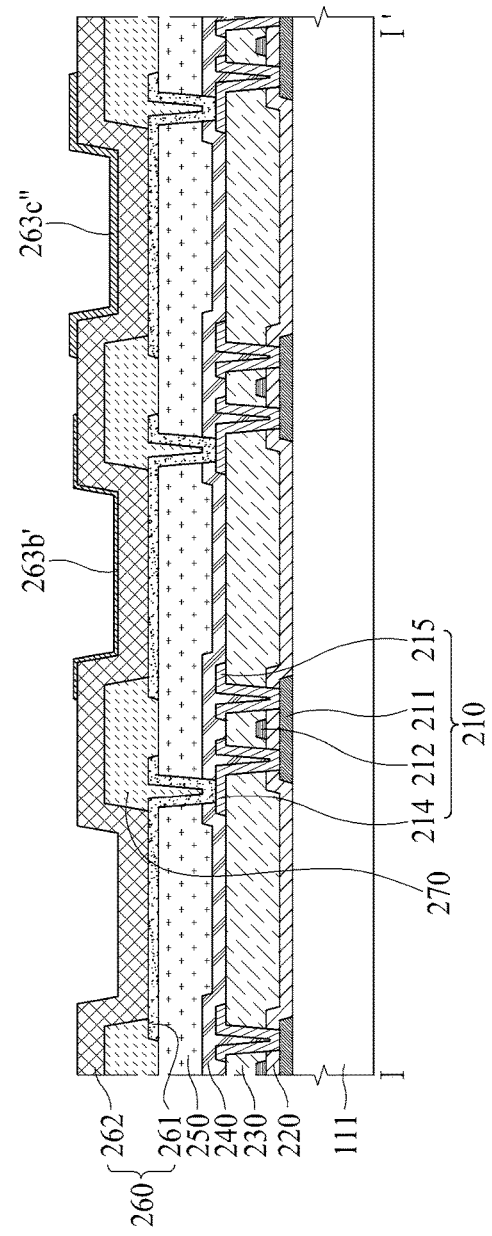

Third, as shown in FIGS. 15D and 15E, the area for the second subpixel (P2) is irradiated with UV, to thereby form second electrodes 263b' and 263c'', as indicated in S403 of FIG. 14.

In detail, as shown in FIG. 15D, under the condition that a third mask (M3) having a transmitting portion (T) is disposed on the organic light emitting layer 262, the organic light emitting layer 262 is irradiated with UV. In this case, the transmitting portion (T) is positioned in the area for the second subpixel (P2). The first and third subpixels (P1, P3) are not irradiated with UV, and only the second subpixel (P2) is irradiated with UV.

As shown in FIG. 5, the photo-reactive organic film 280 includes diarylethene molecules. Thus, the metal film is deposited only on the area of the photo-reactive organic film 280 which is irradiated with UV, and the metal film is not deposited on the area of the photo-reactive organic film 280 which is not irradiated with UV. Accordingly, even though an open mask having a transmitting portion for the display area is used instead of a mask having transmitting portions for the second and third subpixel (P2, P3), as shown in FIG. 15E, the second electrodes 263b' and 263c'' may be deposited on the second and third subpixels (P2, P3) irradiated with UV.

Figure 15G:
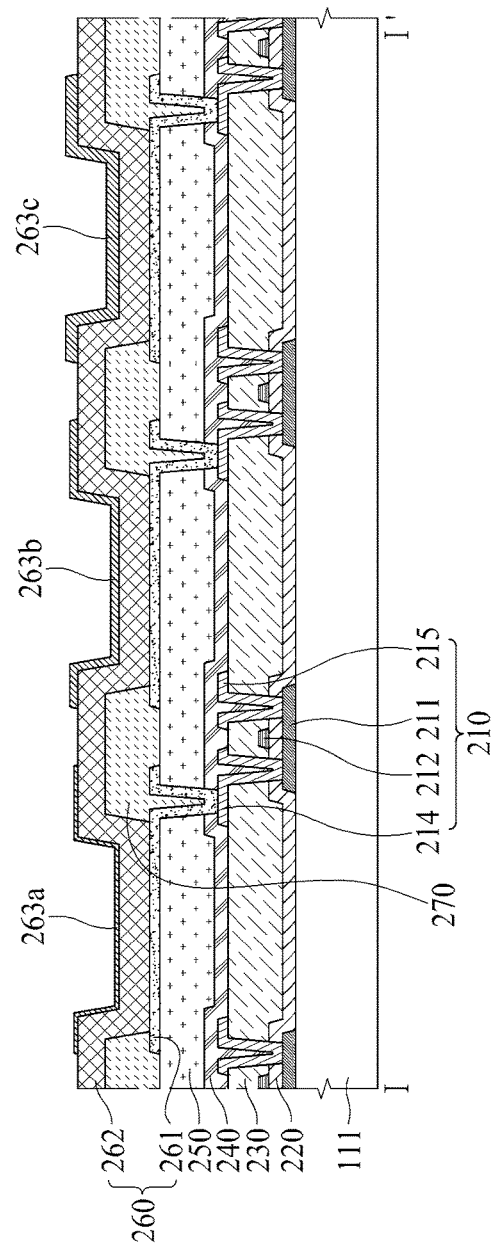

Fourth, as shown in FIGS. 15F and 15G, the area for the first subpixel (P1) is irradiated with UV, to thereby form the second electrodes 263a, 263b, and 263c, as indicated in S404 of FIG. 14.

In detail, as shown in FIG. 15F, under the condition that a fourth mask (M4) having a transmitting portion (T) is disposed on the organic light emitting layer 262, the organic light emitting layer 262 is irradiated with UV. In this case, the transmitting portion (T) is positioned in the area for the first subpixel (P1). In this case, the second and third subpixels (P2, P3) are not irradiated with UV, and only the first subpixel (P1) is irradiated with UV.

As shown in FIG. 5, the photo-reactive organic film 280 includes diarylethene molecules. Thus, the metal film is deposited only on the area of the photo-reactive organic film 280 which is irradiated with UV, and the metal film is not deposited on the area of the photo-reactive organic film 280 which is not irradiated with UV. Accordingly, even though an open mask having a transmitting portion for the display area is used instead of a mask having transmitting portions for the first to third subpixels (P1, P2, P3), as shown in FIG. 15G, the second electrodes 263a, 263b, and 263c may be deposited on the first to third subpixels (P1, P2, P3) irradiated with UV. When the transmittance of the second mask M2, third mask M3, and the fourth mask M4 are substantially similar, a hydrophobicity of a first portion of the photo-reactive organic film 280 below the second electrode 263a of the first subpixel P1, a hydrophobicity of a second portion of the photo-reactive organic film 280 below the second electrode 263b of the second subpixel P2, and a hydrophobicity of a third portion of the photo-reactive organic film 280 below the second electrode 263c of the third subpixel P3 may be substantially same with one another. The hydrophobicity of the first portion, the second portion, and the third portion of the photo-reactive organic film 280 may be smaller than a portion of the photo-reactive organic film 280 that does not overlap with the second electrodes 263a, 263b, and 263c.

Meanwhile, the metal film is deposited on the photo-reactive organic film 280 of the third subpixel (P3) by the steps of S402, S403, and S404, the metal film is deposited on the photo-reactive organic film 280 of the second subpixel (P2) by the steps of S403 and S404, and the metal film is deposited on the photo-reactive organic film 280 of the first subpixel (P1) by the steps of S404. Accordingly, the second electrode 263c of the third subpixel (P3) has the largest thickness, and the second electrode 263a of the first subpixel (P1) has the smallest thickness. That is, the thickness of the second electrode 263a for the first subpixel (P1), the thickness of the second electrode 263b for the second subpixel (P2), and the thickness of the second electrode 263c for the third subpixel (P3) may be different from one another.

Figure 15H:
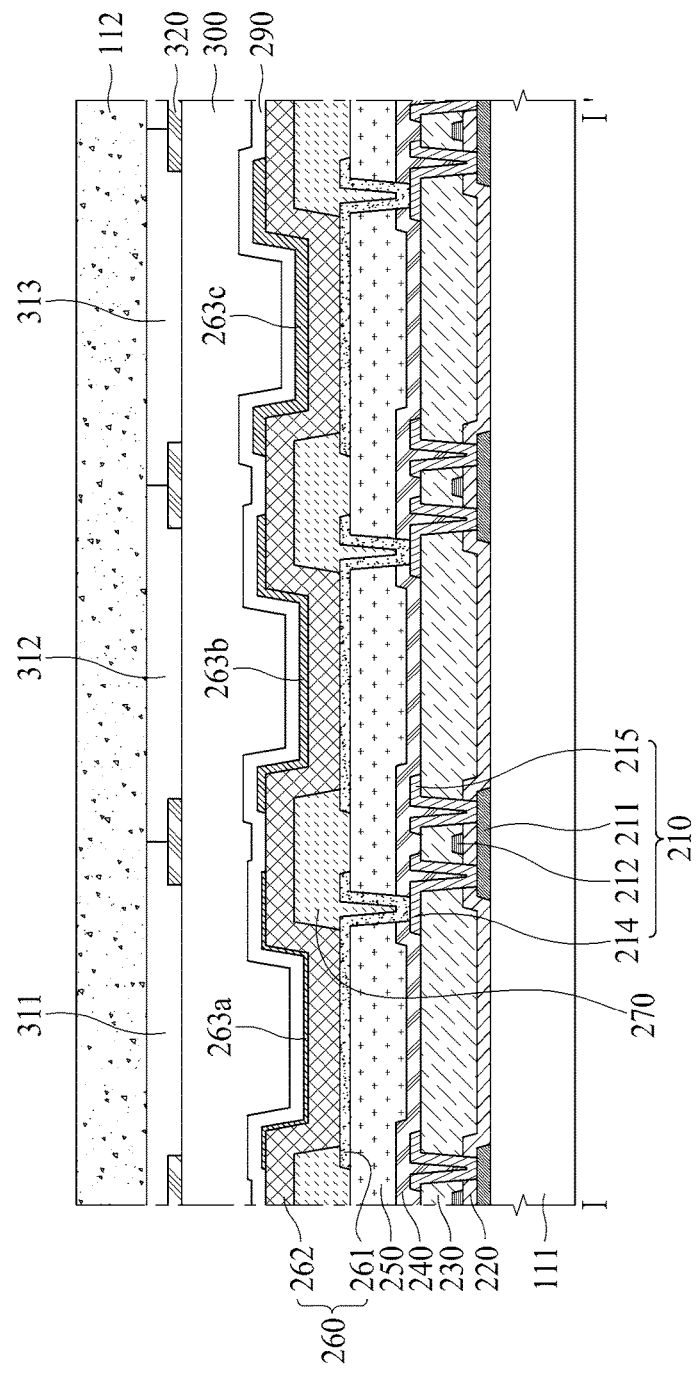

Fifth, as shown in FIG. 15H, the semi-transmissive electrode 290 and the encapsulation film 300 are provided on the photo-reactive organic film 280, and the second electrodes 263a, 263b, and 263c, as indicated in S405 of FIG. 14.

The step S405 of FIG. 14 is the same as the step S104 of FIG. 6, whereby a detailed description for the step S405 of FIG. 14 will be omitted ('S405' of FIG. 14).

As described above, after the second electrode 263c' is deposited by irradiating the area for the third subpixel (P3) with UV, the second electrodes 263b' and 263c'' are deposited by irradiating the area for the second subpixel (P2) with UV, and then the second electrodes 263a, 263b, and 263c are deposited by irradiating the area for the first subpixel (P1) with UV. As a result, the thickness of the second electrode 263a in the first subpixel (P1), the thickness of the second electrode 263b in the second subpixel (P2), and the thickness of the second electrode 263c in the third subpixel (P3) may be different from one another. As a result, it is possible to optimize the micro-cavity distance in each of the first to third subpixels (P1, P2, P3) by the six processes including three UV irradiation processes and three deposition processes of the metal film. Accordingly, it is possible to largely reduce the number of manufacturing processes, to simplify the manufacturing process, and to reduce a manufacturing cost.

According to the present disclosure, the first electrode 261 is formed of the metal material with high reflectance, and the semi-transmissive electrode 290 is formed of the semi-transmissive metal material, whereby it is possible to realize the micro-cavity structure by the first electrode 261 and the semi-transmissive electrode 290, to thereby improve the emission efficiency of light emitted from the organic light emitting layer 262.

Also, the first optical auxiliary layer 281 of the first subpixel (P1), the second optical auxiliary layer 282 of the second subpixel (P2), and the third optical auxiliary layer 283 of the third subpixel (P3) have the different thicknesses from one another, whereby it is possible to optimize the micro-cavity distance in each of the first to third subpixels (P1, P2, P3).

Accordingly, the deposition process of the photo-reactive organic film 280, the UV irradiation process, and the deposition process of the metal film are additionally carried out so that the first optical auxiliary layer 281 of the first subpixel (P1), the second optical auxiliary layer 282 of the second subpixel (P2), and the third optical auxiliary layer 283 of the third subpixel (P3) have the different thicknesses from one another. Thus, it is possible to largely reduce the number of manufacturing processes, to thereby simplify the manufacturing process, and to reduce the manufacturing cost.

According to the embodiment of the present invention, the second electrode 263a of the first subpixel (P1), the second electrode 263b of the second subpixel (P2), and the second electrode 263c of the third subpixel (P3) have the different thicknesses from one another by adjusting the amount of UV irradiation applied to the first to third subpixels (P1, P2, P3), whereby it is possible to optimize the micro-cavity distance in each of the first to third subpixels (P1, P2, P3).

Furthermore, the deposition process of the photo-reactive organic film 280, the UV irradiation process, and the deposition process of the metal film are additionally carried out so that the second electrode 263a of the first subpixel (P1), the second electrode 263b of the second subpixel (P2), and the second electrode 263c of the third subpixel (P3) have the different thicknesses from one another. Thus, it is possible to largely reduce the number of manufacturing processes, to thereby simplify the manufacturing process, and to reduce the manufacturing cost.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display (OLED) device comprising a pixel having a first subpixel, a second subpixel, and a third subpixel,
    wherein each of the first subpixel, the second subpixel, and the third subpixel includes:
        a first electrode including a reflective metal material,
        an organic light emitting layer disposed on the first electrode,
        a second electrode disposed on the organic light emitting layer and formed of a transparent metal material,
        a photo-reactive organic film disposed on the second electrode, and
        a semi-transmissive electrode disposed on the photo-reactive organic film,
    wherein a first distance between the first electrode and the semi-transmissive electrode of the first subpixel, a second distance between the first electrode and the semi-transmissive electrode of the second subpixel, and a third distance between the first electrode and the semi-transmissive electrode of the third subpixel are different from one another,
    wherein the first subpixel further includes a first optical auxiliary layer disposed between a first part of the photo-reactive organic film and the semi-transmissive electrode, and
    wherein the second subpixel further includes a second optical auxiliary layer disposed on a second part of the photo-reactive organic film and the semi-transmissive electrode.

2. The OLED device according to claim 1, further comprising:
    a third optical auxiliary layer disposed between a third part of the photo-reactive organic film and the semi-transmissive electrode.

3. The OLED device according to claim 2, wherein the photo-reactive organic film includes diarylethene molecules.

4. The OLED device according to claim 3, wherein a thickness of the first optical auxiliary layer, a thickness of the second optical auxiliary layer, and a thickness of the third optical auxiliary layer are different from one another.

5. The OLED device according to claim 2, wherein the semi-transmissive electrode of the first subpixel is disposed on the first optical auxiliary layer, wherein the semi-transmissive electrode of the second subpixel is disposed on the second optical auxiliary layer, and the semi-transmissive electrode of the third subpixel is disposed on the third optical auxiliary layer.

6. An organic light emitting display (OLED) device comprising a pixel having a first subpixel, a second subpixel, and a third subpixel, wherein each of the first subpixel, the second subpixel, and the third subpixel includes:
    a first electrode including a reflective metal material,
    a light emitting layer disposed on the first electrode,
    a photo-reactive organic film disposed on the light emitting layer,
    a second electrode disposed on the photo-reactive organic film and formed of a transparent metal material, and
    a semi-transmissive electrode disposed on the second electrode,
wherein a thickness of the second electrode in the first subpixel, a thickness of the second electrode in the second subpixel, and a thickness of the second electrode in the third subpixel are different from one another.

7. The OLED device according to claim 6, wherein the photo-reactive organic film includes diarylethene molecules.

8. The OLED device according to claim 6, wherein the photo-reactive organic film has an electron transporting capacity.

9. A light emitting display device, comprising:
    a substrate;
    a first subpixel on the substrate, the first subpixel including:
        a first bottom electrode,
        at least a first part of an organic light emitting layer on the first bottom electrode,
        a first conductive film on the first part of the organic light emitting layer, and
        at least a first part of a semi-transmissive electrode on the first conductive film; and
    a second subpixel on the substrate, the second subpixel including:
        a second bottom electrode,
        at least a second part of the organic light emitting layer on the second bottom electrode,
        a second conductive film on the second part of the organic light emitting layer, and
        at least a second part of the semi-transmissive electrode on the second conductive film,
    wherein a thickness of the second conductive film is greater than a thickness of the first conductive film.

10. The light emitting display device of claim 9, further comprising an organic film disposed below the first conductive film and the second conductive film, wherein a hydrophobicity of a first portion of the organic film below the first conductive film is larger than a hydrophobicity of a second portion of the organic film below the second conductive film, and wherein the hydrophobicity of the first portion and the second portion of the organic film is smaller than a hydrophobicity of a third portion of the organic film that does not overlap with the first conductive film or the second conductive film.

11. The light emitting display device of claim 9, further comprising an organic film disposed below the first conductive film and the second conductive film, wherein a hydrophobicity of a first portion of the organic film below the first conductive film is substantially same as a hydrophobicity of a second portion of the organic film below the second conductive film, and wherein the hydrophobicity of the first portion and the second portion of the organic film is smaller than a hydrophobicity of a third portion of the organic film that does not overlap with the first conductive film or the second conductive film.

12. The light emitting display device of claim 9, further comprising an upper electrode disposed between the first conductive film and the first part of the organic light emitting layer, and disposed between the second conductive film and the second part of the organic light emitting layer.

13. The light emitting display device of claim 12, further comprising a photo-reactive organic film disposed between the first conductive film and the upper electrode, and disposed between the second conductive film and the upper electrode.

14. The light emitting display device of claim 9, wherein the first conductive film is a first cathode electrode of the first subpixel and the second conductive film is a second cathode electrode of the second subpixel.

15. The light emitting display device of claim 14, wherein the organic light emitting layer includes a photo-reactive organic film, and wherein the photo-reactive organic film is in contact with the first conductive film and the second conductive film.

16. The light emitting display device of claim 9, further comprising a photo-reactive film organic disposed below the first conductive film and the second conductive film, wherein the photo-reactive organic film includes diarylethene molecules.

17. The light emitting display device of claim 9, further comprising:
a third subpixel on the substrate, the third subpixel including:
a third bottom electrode,
at least a third part of the organic light emitting layer on the third bottom electrode,
a third conductive film on the third part of the organic light emitting layer, and
at least a third part of the semi-transmissive electrode on the third conductive film,
wherein a thickness of the third conductive film is greater than the thickness of the second conductive film.

18. The light emitting display device of claim 9, wherein the first conductive film and the second conductive film are formed of a transparent conductive oxide material.

19. The light emitting display device of claim 9, wherein the semi-transmissive electrode includes at least one of magnesium (Mg), argentum (Ag), or an alloy of magnesium (Mg) and argentum (Ag).

* * * * *